United States Patent
Kwon

(10) Patent No.: US 11,244,712 B2
(45) Date of Patent: Feb. 8, 2022

(54) SEMICONDUCTOR DEVICE AND METHOD FOR FABRICATING THE SAME

(71) Applicant: SK hynix Inc., Gyeonggi-do (KR)

(72) Inventor: Se Han Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/011,632

(22) Filed: Sep. 3, 2020

(65) Prior Publication Data

US 2021/0304803 A1 Sep. 30, 2021

(30) Foreign Application Priority Data

Mar. 31, 2020 (KR) .................. 10-2020-0039204

(51) Int. Cl.
*G11C 8/14* (2006.01)
*H01L 23/522* (2006.01)
*G11C 7/18* (2006.01)
*H01L 27/108* (2006.01)

(52) U.S. Cl.
CPC ............... *G11C 8/14* (2013.01); *G11C 7/18* (2013.01); *H01L 23/5226* (2013.01); *H01L 27/10814* (2013.01)

(58) Field of Classification Search
CPC ......... G11C 8/14; G11C 7/18; H01L 23/5226; H01L 27/10814
USPC .............................................. 365/63, 230.06
See application file for complete search history.

(56) References Cited

U.S. PATENT DOCUMENTS

| | | | |
|---|---|---|---|
| 6,573,546 B2 * | 6/2003 | Ohyu ................ | H01L 27/10897 257/296 |
| 7,663,233 B2 * | 2/2010 | Lim ..................... | H01L 23/5223 257/734 |
| 7,719,868 B2 * | 5/2010 | Vollrath .................... | G11C 7/18 365/63 |
| 9,029,957 B2 | 5/2015 | Yoon | |
| 9,741,723 B2 | 8/2017 | Tomoyama | |
| 2015/0054086 A1 * | 2/2015 | Saino ................ | H01L 27/10897 257/369 |
| 2015/0126013 A1 * | 5/2015 | Hwang ............... | H01L 23/5226 438/381 |
| 2016/0043136 A1 * | 2/2016 | Kim ..................... | H01L 23/535 257/295 |
| 2016/0079363 A1 * | 3/2016 | Lee ......................... | H01L 45/06 711/104 |
| 2017/0084710 A1 * | 3/2017 | Koh .................. | H01L 27/10823 |
| 2018/0277546 A1 * | 9/2018 | Wang ................ | H01L 27/10805 |
| 2018/0342521 A1 * | 11/2018 | Son ................... | H01L 21/76816 |
| 2018/0350835 A1 * | 12/2018 | Lee ................... | H01L 21/02645 |
| 2019/0139963 A1 * | 5/2019 | Hong ................ | H01L 27/10888 |
| 2019/0296026 A1 * | 9/2019 | Ji ........................ | H01L 21/3213 |
| 2019/0355728 A1 * | 11/2019 | Kim .................. | H01L 29/4958 |
| 2020/0083229 A1 * | 3/2020 | Kim .................... | G11C 11/4097 |

(Continued)

*Primary Examiner* — Michael T Tran
(74) *Attorney, Agent, or Firm* — IP & T Group LLP

(57) ABSTRACT

A semiconductor device includes a substrate including an active region and a dummy active region that are spaced apart by an isolation layer, a buried word line extending from the active region to the dummy active region, and a contact plug coupled to an edge portion of the buried word line, wherein an upper surface of the active region is positioned at a higher level than an upper surface of the buried word line, and an upper surface of the dummy active region is positioned at a lower level than the upper surface of the buried word line.

21 Claims, 20 Drawing Sheets

(56) References Cited

U.S. PATENT DOCUMENTS

| | | | |
|---|---|---|---|
| 2020/0091303 A1* | 3/2020 | Nam | H01L 29/78 |
| 2020/0119021 A1* | 4/2020 | Ma | H01L 21/76805 |
| 2020/0127079 A1* | 4/2020 | Kim | H01G 4/008 |
| 2020/0219809 A1* | 7/2020 | Kim | H01L 23/53219 |
| 2020/0343253 A1* | 10/2020 | Lin | H01L 21/265 |
| 2021/0082813 A1* | 3/2021 | Chuang | H01L 23/5283 |

* cited by examiner

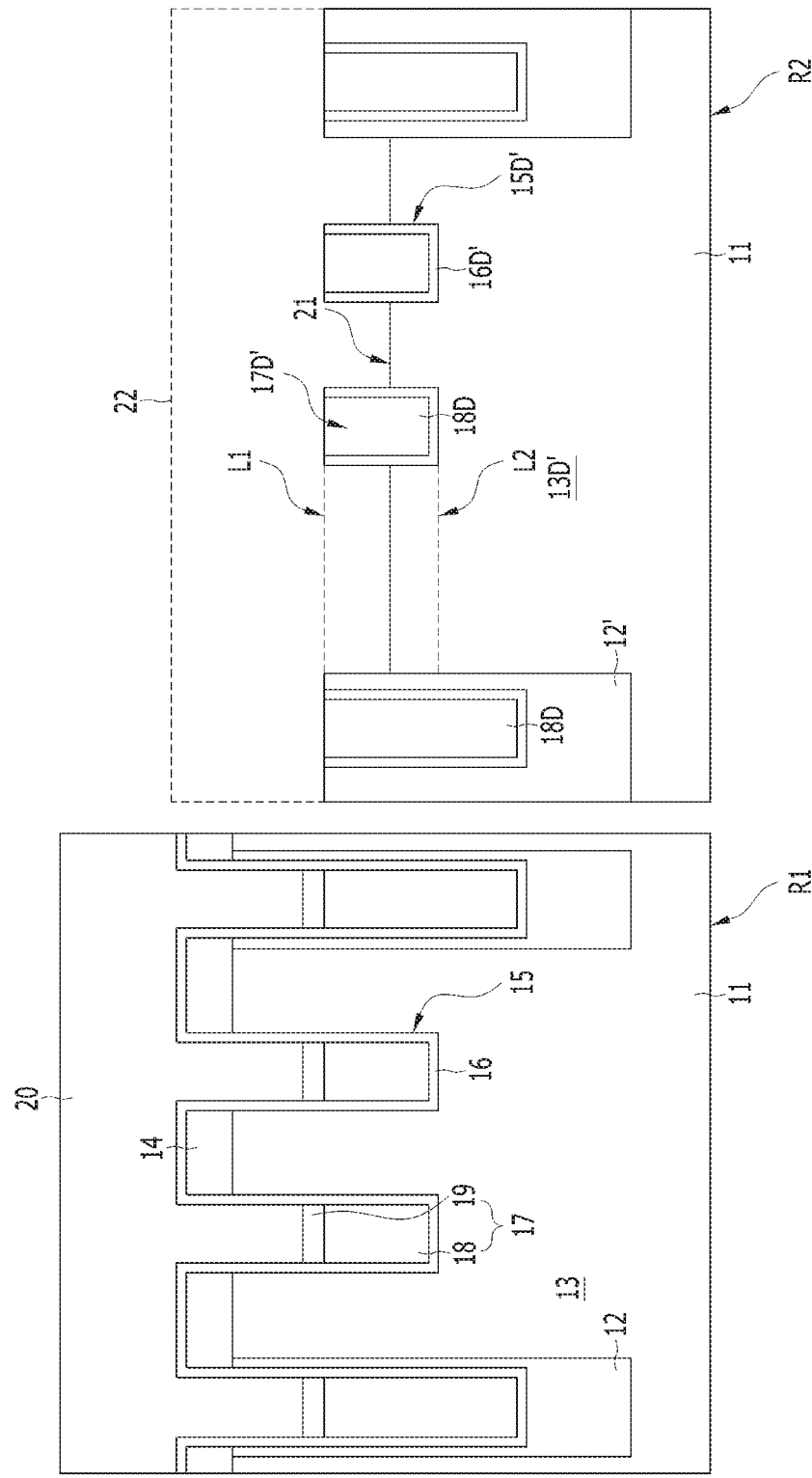

SEMICONDUCTOR DEVICE AND METHOD FOR FABRICATING THE SAME

CROSS-REFERENCE TO RELATED APPLICATIONS

The present application claims priority to Korean Patent Application No. 10-2020-0039204, filed on Mar. 31, 2020, which is incorporated herein by reference in its entirety.

BACKGROUND

1. Field

Various embodiments of the present invention relate to a semiconductor device and, more particularly, to a semiconductor device including a buried word line, and a method for fabricating the semiconductor device.

2. Description of the Related Art

Generally, the use of a buried word line for improving the characteristics of a transistor in a semiconductor device is well known. However, significant research and product development efforts are focused in developing new improved structures that exhibit improved performance characteristics.

SUMMARY

Embodiments of the present invention are directed to a semiconductor device including a buried word line which exhibits significantly improved reliability, and a method for fabricating the same.

In accordance with an embodiment of the present invention, a semiconductor device includes: a substrate including an active region and a dummy active region that are spaced apart by an isolation layer; a buried word line extending from the active region to the dummy active region; and a contact plug coupled to an edge portion of the buried word line, wherein an upper surface of the active region is positioned at a higher level than an upper surface of the buried word line, and an upper surface of the dummy active region is positioned at a lower level than the upper surface of the buried word line.

In accordance with another embodiment of the present invention, a semiconductor device includes: a substrate including a plurality of active regions and a plurality of dummy active regions that are spaced apart by an isolation layer; a plurality of buried word lines that are buried in the substrate and extend from the active regions to the dummy active regions; a capping layer that covers an edge portion of each of the buried word lines; and a contact plug coupled to the edge portion of each of the buried word lines, wherein the edge portion of each of the buried word lines includes a buried portion buried in the dummy active regions; and a protruding portion formed over the buried portion and having a higher level than an upper surface of a dummy active region.

In accordance with yet another embodiment of the present invention, a method for fabricating a semiconductor device includes: forming an active region and a dummy active region in the substrate; forming a buried word line that is buried in the substrate and extends from the active region to the dummy active region; recessing the dummy active region lower than an upper surface of an edge portion of the buried word line; forming a capping layer over the recessed dummy active region; and forming a contact plug that penetrates the capping layer and is coupled to the edge portion of the buried word line.

In accordance with another embodiment of the present invention, a semiconductor device includes: an active region and a dummy active region separated by an isolation layer, the dummy active region having an upper surface that is positioned lower than an upper surface of the active region; and a buried word line extending from the active region to the dummy active region, wherein the buried word line is fully buried within the active region and only partially buried in the dummy active region.

These and other features and advantages of the present invention will be better understood from the following detailed description of specific embodiments of the invention in conjunction with the following drawings.

BRIEF DESCRIPTION OF THE DRAWINGS

FIGS. 6A to 6H are cross-sectional views illustrating an example of a method for fabricating a semiconductor device in accordance with an embodiment of the present invention.

DETAILED DESCRIPTION

Figure 1:
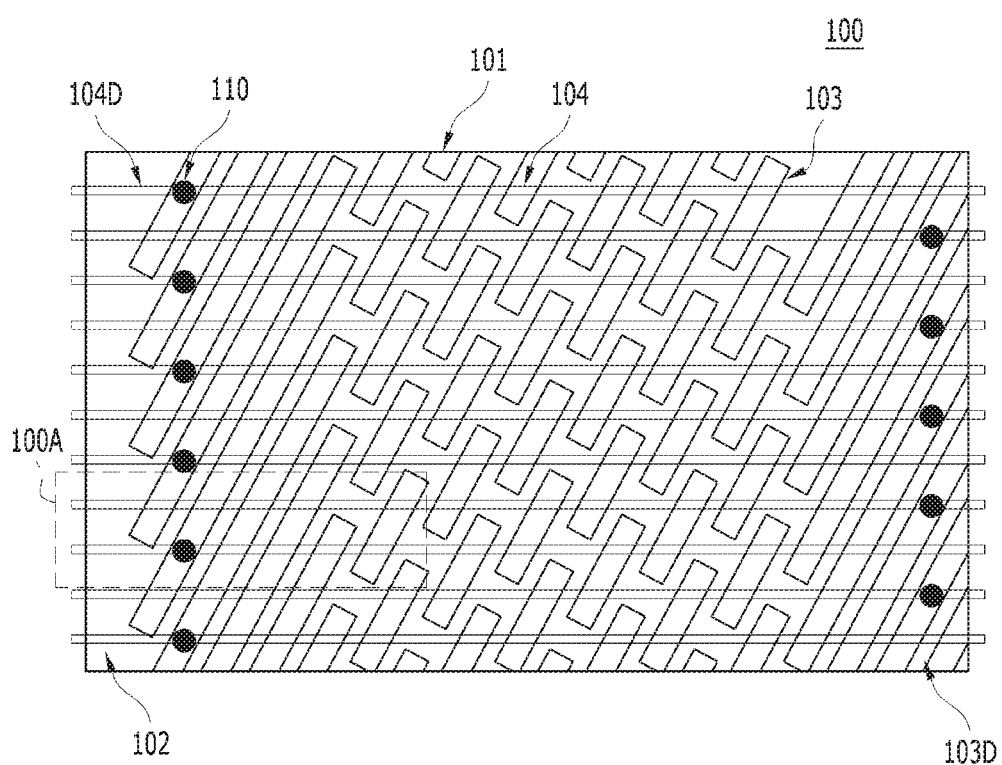
FIG. 1 is a plan view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

When a first element is referred to as being "over" a second element, it not only refers to a case where the first element is formed directly on the second element but also a case where a third element exists between the first element and the second element.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

Figure 2A:
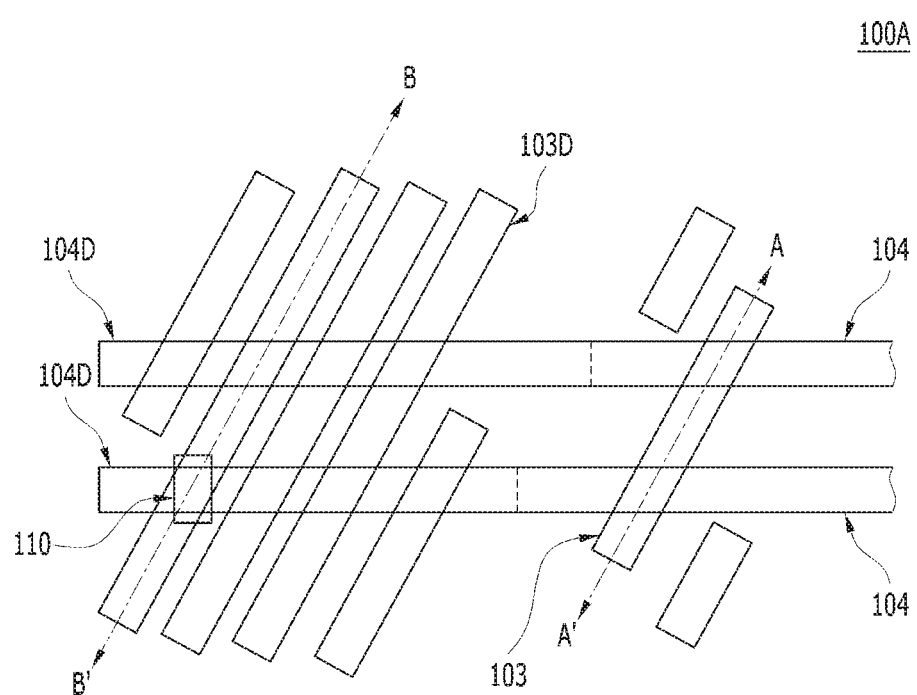
FIG. 2A is an enlarged view illustrating a portion of FIG. 1.
Figure 2B:
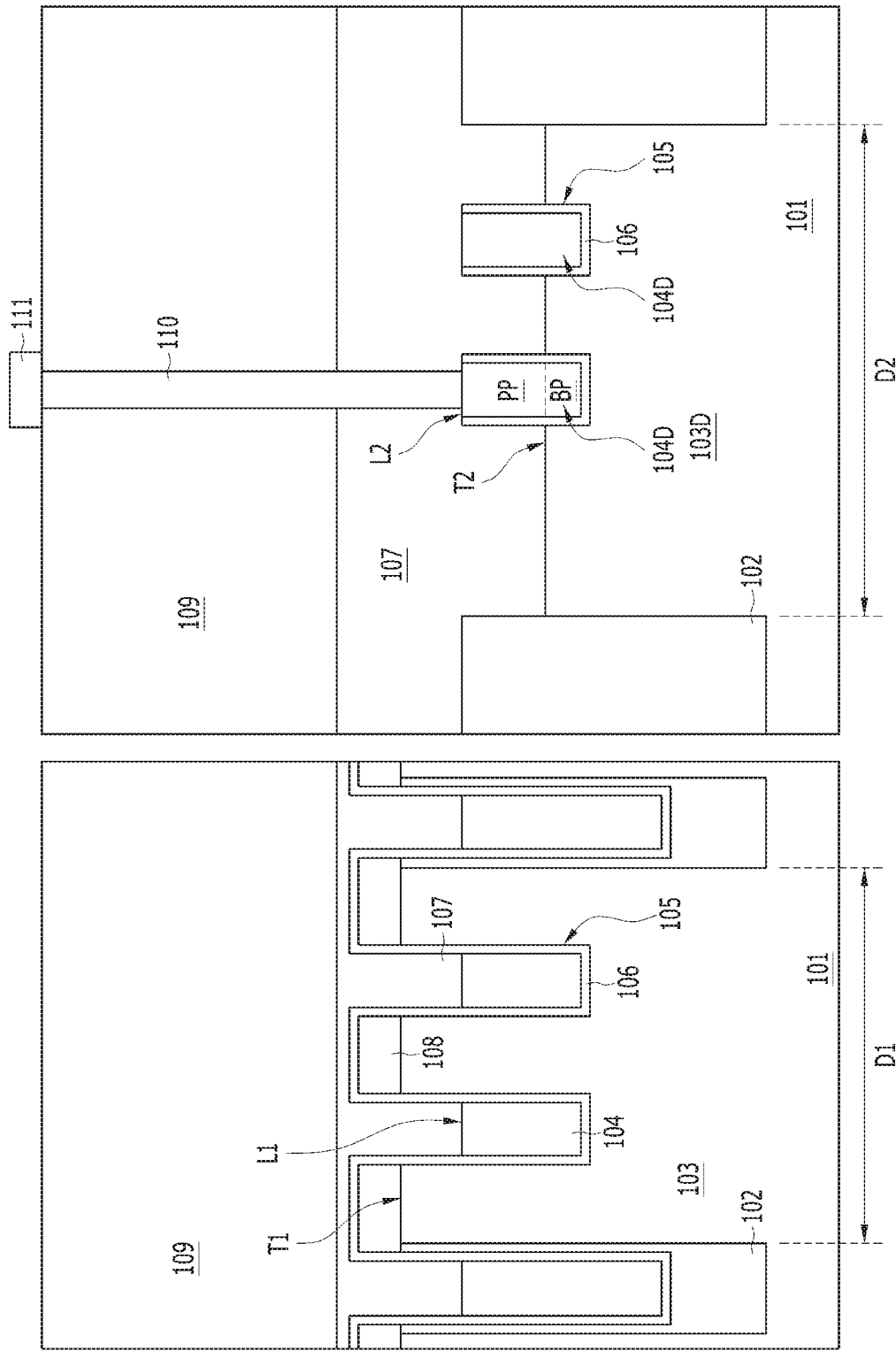
FIG. 2B presents cross-sectional views taken along a line A-A' and a line B-B' shown in FIG. 2A.

FIG. 1 is a plan view illustrating a semiconductor device 100 in accordance with an embodiment of the present invention. FIG. 2A is an enlarged view illustrating a portion 100A of FIG. 1. FIG. 2B presents cross-sectional views taken along a line A-A' and a line B-B' shown in FIG. 2A.

Referring to FIGS. 1, 2A, and 2B, the semiconductor device 100 may include a substrate 101 provided with a plurality of active regions 103 and a plurality of dummy active regions 103D that are spaced apart from each other by an isolation layer 102. The semiconductor 100 device may further include a buried word line 104 that is buried in the substrate 101 and extends from the active regions 103 to the dummy active regions 103D, and a contact plug 110 that is coupled to an edge portion 104D of the buried word line 104. The buried word line 104 is fully buried within the active region 103 and only partially buried in the dummy active region 103D.

The active regions 103 may all have the same shape. From the perspective of a top view, the individual active regions 103 may have an island-shape. The individual active regions 103 may extend in the A-A' direction. The individual active regions 103 may have a long axis and a short axis, and the length of the long axis may be greater than the length of the short axis. The dummy active regions 103D may have the same length or different lengths. The individual dummy active regions 103D may extend along the B-B' direction. The B-B' direction may be the same as the A-A' direction. The individual dummy active regions 103 may have a long axis and a short axis, and the length of the long axis may be greater than the length of the short axis. The individual dummy active regions 103D may be greater than the individual active regions 103. For example, the individual dummy active regions 103D and the individual active regions 103 may extend with the same directionality, but the individual dummy active regions 103D may extend longer than the individual active regions 103. As described above, the dummy active regions 103D may have a line shape that is elongated along the B-B' direction. The active regions 103 may also have a line shape that is elongated along the A-A' direction. The dummy active regions 103D may have a line shape that is significantly longer than the line shape of the active regions 103. The line shape of the active regions may also be referred to hereinafter as a short island shape. The individual active regions 103 may have a size that is sufficiently large so that two buried word lines 104 are placed therein, and the individual dummy active regions 103D may have a size that is sufficiently large so that at least three or more buried word lines 104 are placed therein. In some embodiments of the present invention, two word lines may be disposed in each dummy active region 103D, but in this case, too, the individual dummy active regions 103D may be greater than the individual active regions 103. The individual active regions 103 may have a first length D1, and the individual dummy active regions 103D may have a second length D2. The second length D2 may be greater than the first length D1.

The upper surface T1 of an active region 103 may be positioned at a higher level than the upper surface T2 of a dummy active region 103D. The upper surface T1 of the active region 103 may be positioned at a higher level than the upper surface L1 of the buried word line 104. The upper surface T2 of the dummy active region 103D may be positioned at a lower level than the upper surface L2 of the edge portion 104D of the buried word line 104. The upper surface L2 of the edge portion 104D of the buried word line 104 may be positioned at a lower level than the upper surface T1 of the active region 103.

The edge portion 104D of the buried word line 104 may include a buried portion BP buried in the dummy active region 103D, and a protruding portion PP formed over the buried portion BP. The upper surface L2 of the edge portion 104D of the buried word line 104 may be provided by the upper surface of the protruding portion PP. The upper surface L2 of the protruding portion PP may be positioned at a higher level than the upper surface T2 of the dummy active region 103D. The upper surface L2 of the protruding portion PP may be positioned at a lower level than the upper surface T1 of the active region 103. The upper surface of the buried portion BP and the upper surface T2 of the dummy active region 103D may be positioned at the same level. The height of the protruding portion PP may be greater than the height of the buried portion BP. The protruding portion PP may include sidewalls and the upper surface L2.

The sidewalls and the upper surface L2 of the protruding portion PP may be covered by a capping layer 107. The bottom surface and the sidewalls of the buried portion BP may be covered by a gate dielectric layer 106. The gate dielectric layer 106 may extend to cover the sidewalls of the protruding portion PP. The capping layer 107 may cover sidewalls of the protruding portion PP over the gate dielectric layer 106. The capping layer 107 may extend to cover the upper surface of the isolation layer 102. The capping layer 107 may cover the upper portion of the buried word line 104, but may be buried in the substrate 101 and extend from the active regions 103 to the dummy active regions 103D.

An inter-layer dielectric layer 109 may be formed over the capping layer 107. The contact plug 110 may penetrate the inter-layer dielectric layer 109 and the capping layer 107 to be coupled to the edge portion 104D of the buried word line 104. The contact plug 110 may be coupled to the protruding portion PP of the edge portion 104D of the buried word line 104. A metal wire 111 may be formed over the contact plug 110. The metal wire 111 may be formed to be in direct contact with the contact plug 110.

Neighboring contact plugs 110 may be disposed on the same axis or different axes. For example, referring back to FIG. 1, the contact plugs 110 may be disposed in a zigzag arrangement.

According to the above-described embodiment of the present invention, bending of the word line 104 may be suppressed by forming the dummy active regions 103D longer than the active regions 103.

Since the upper surface T2 of the dummy active region 103D is lower than the upper surface L2 of the edge portion 104D of the buried word line 104, the physical distance between the contact plug 110 and the dummy active region 103D may increase. This may prevent a short circuit between the contact plug 110 and the dummy active region 103D. Since the capping layer 107 between the edge portions 104D of the buried word lines 104 is gap-filled, a short circuit between the contact plug 110 and the dummy active region 103D may be further prevented. Since the capping layer 107 is gap-filled between the edge portions 104D of the neighboring buried word lines 104, widening of the bottom portion of the contact plug 110 may also be suppressed.

Referring back to FIG. 2B, the buried word line 104 may include a metal-based material such as a metal nitride, metal, a doped semiconductor material such as, for example, doped polysilicon or a combination thereof. Examples of suitable metals may include tungsten, copper, aluminum, titanium, tantalum and the like. Examples of suitable metal nitrides may include titanium nitride, tungsten nitride, tantalum nitride and the like. For example, the buried word line 104 and the edge portion 104D of the buried word line 104 may all include a metal-based material. Herein, the edge portion 104D of the buried word line may have a lower surface than the buried word line 104.

Figure 3:
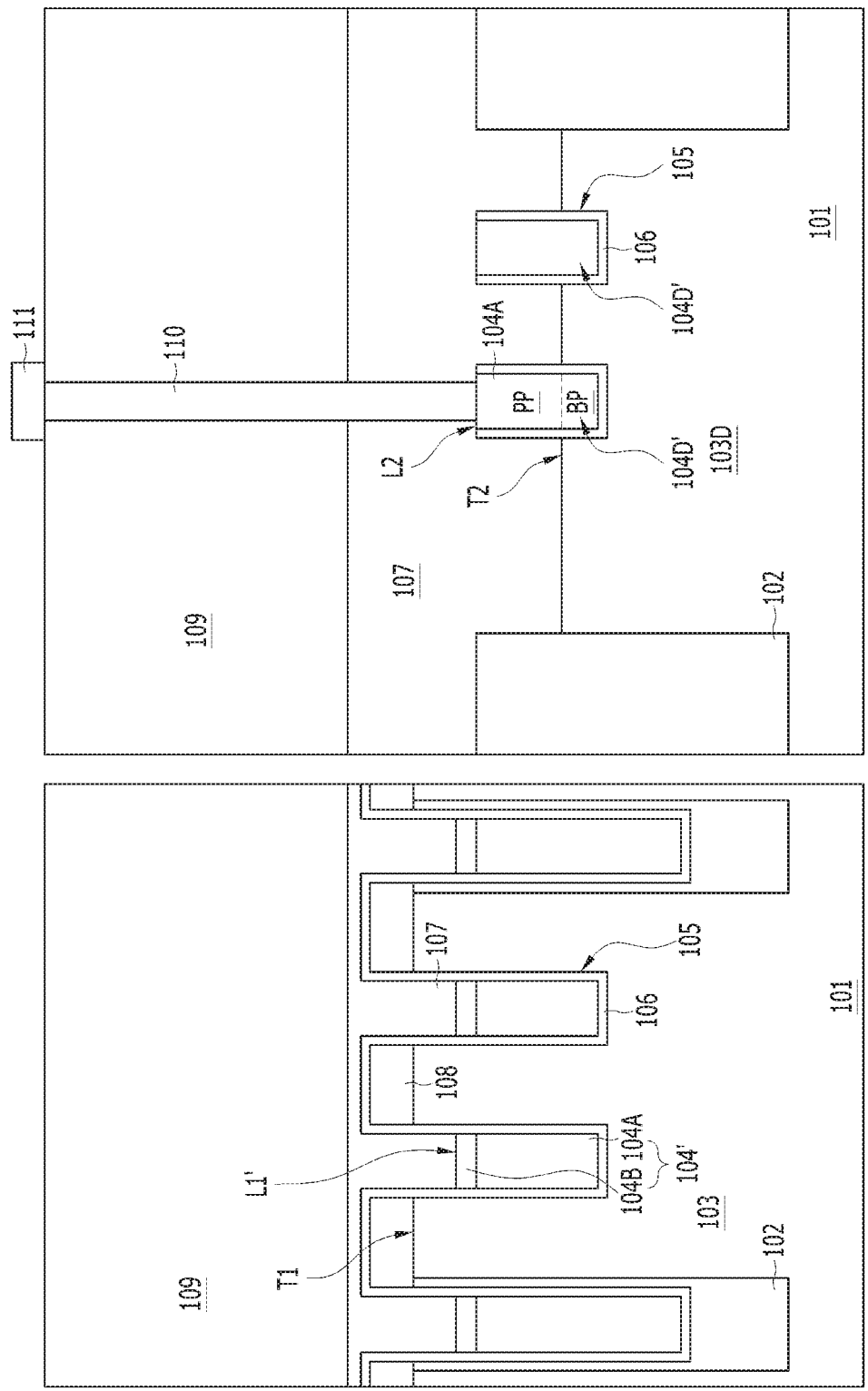
FIG. 3 is a cross-sectional view of a semiconductor device in accordance with another embodiment of the present invention.

FIG. 3 is a cross-sectional view of a semiconductor device in accordance with another embodiment of the present invention. The semiconductor device of FIG. 3 may include some similar elements to the semiconductor device shown in FIG. 2B. Hereinafter, a detailed description of any overlapping constituent elements may be omitted.

Referring to FIG. 3, a buried word line 104' crossing the active region 103 may include a stack of a metal-based material 104A and a semiconductor material 104B. The edge portion 104D' of the buried word line 104' may also include the metal-based material 104A. The buried portion BP and the protruding portion PP, which form the edge portion 104D' of the buried word line 104' crossing the dummy active region 103D, may be all formed of a metal-based material 104A.

The upper surface T1 of the active region 103 may be positioned at a higher level than the upper surface T2 of the dummy active region 103D. The upper surface T1 of the active region 103 may be positioned at a higher level than the upper surface L1' of the buried word line 104'. The upper surface T2 of the dummy active region 103D may be positioned at a lower level than the upper surface L2 of the edge portion 104D' of the buried word line 104'. The upper surface L2 of the edge portion 104D' of the buried word line 104' may be positioned at a lower level than the upper surface T1 of the active region 103.

The edge portion 104D' of the buried word line 104' may include a buried portion BP buried in the dummy active region 103D and a protruding portion PP positioned over the buried portion BP. The upper surface L2 of the edge portion 104D' of the buried word line 104' may be provided by the upper surface of the protruding portion PP. The upper surface L2 of the protruding portion PP may be positioned at a higher level than the upper surface T2 of the dummy active region 103D. The upper surface L2 of the protruding portion PP may be positioned at a lower level than the upper surface T1 of the active region 103. The upper surface of the buried portion BP and the upper surface T2 of the dummy active region 103D may be positioned at the same level. The height of the protruding portion PP may be greater than the height of the buried portion BP. The protruding portion PP may include sidewalls and the upper surface L2. The upper surface L2 of the protruding portion PP may be lower than the upper surface L1' of the semiconductor material 104B.

The upper surface L2 of the protruding portion PP may be covered by a capping layer 107. The bottom surface and the sidewalls of the buried portion BP may be covered by a gate dielectric layer 106. The gate dielectric layer 106 may extend to cover the sidewalls of the protruding portion PP as shown in FIG. 3. The capping layer 107 may cover the gate dielectric layer 106 which is over the sidewalls of the protruding portion PP. The buried word line 104' is fully buried within the active region 103 and only partially buried in the dummy active region 103D.

Figure 4:
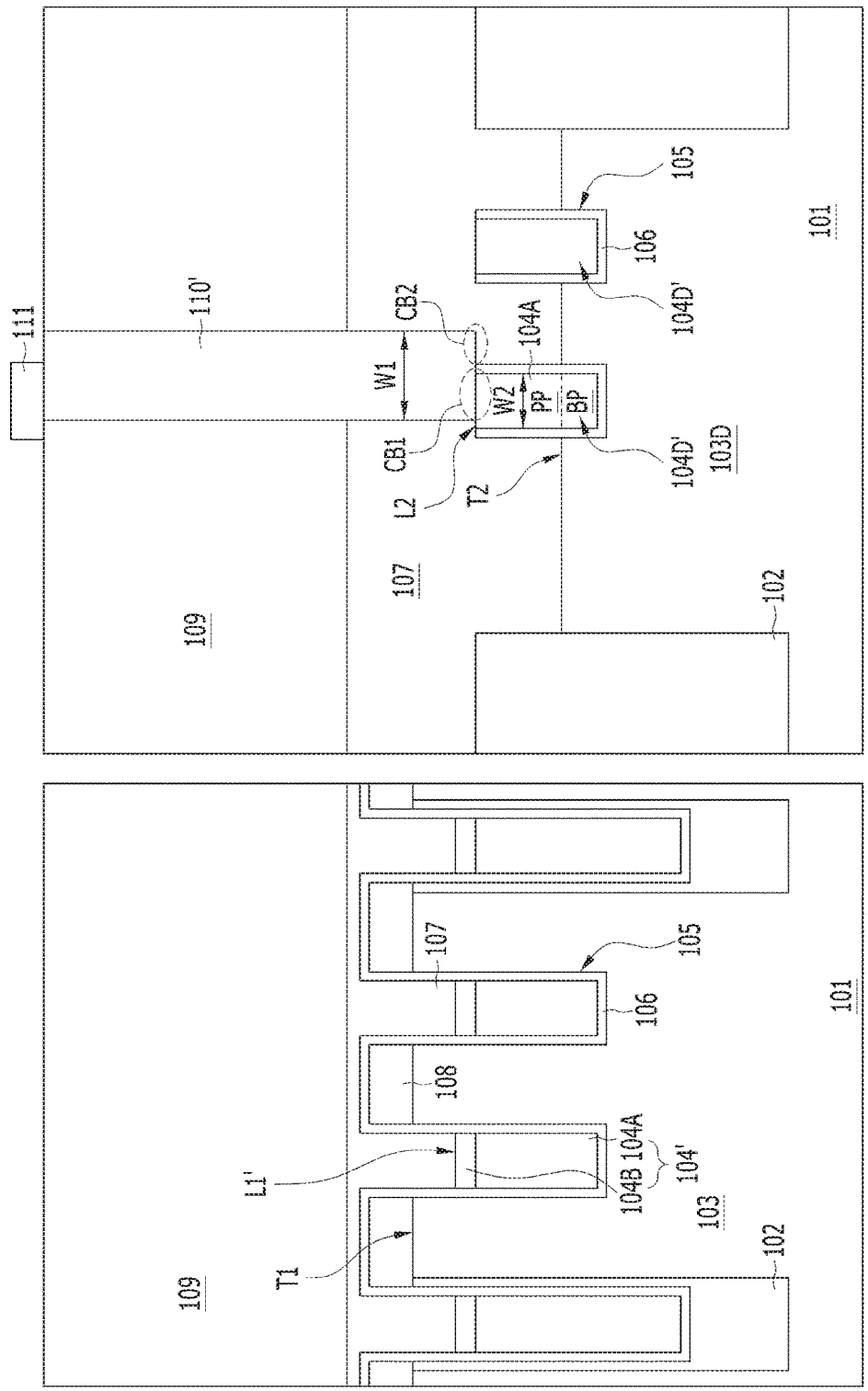
FIG. 4 is a cross-sectional view of a semiconductor device in accordance with another embodiment of the present invention.

FIG. 4 is a cross-sectional view of a semiconductor device in accordance with another embodiment of the present invention. The semiconductor device of FIG. 4 may include some similar elements to the semiconductor device shown in FIG. 3. Hereinafter, a detailed description of any overlapping constituent elements may be omitted.

Referring to FIG. 4, a buried word line 104' crossing the active region 103 may include a stack of a metal-based material 104A and a semiconductor material 104B. An edge portion 104D' of the buried word line 104' may also include the metal-based material 104A. The buried portion BP and the protruding portion PP, which form the edge portion 104D' of the buried word line 104' crossing the dummy active region 103D, may be formed of the metal-based material 104A. A contact plug 110' may be coupled to the edge portion 104D' of the buried word line 104' and, more specifically, to the protruding portion PP of the edge portion 104D'. The width W1 of the contact plug 110' may be greater than the width W2 of the edge portion 104D' of the buried word line 104'.

The bottom portion of the contact plug 110' may include a first portion CB1 overlapping with the edge portion 104D' of the buried word line 104' and a second portion CB2 overlapping with the capping layer 107. For example, the first portion CB1 of the contact plug 110' may overlap and be in direct contact with the upper surface protruding portion PP of the edge portion 104D' of the buried word line 104', and the second portion CB2 of the contact plug 110' may overlap and be in direct contact with the capping layer 107. The buried word line 104' is fully buried within the active region 103 and only partially buried in the dummy active region 103D.

Figure 5:
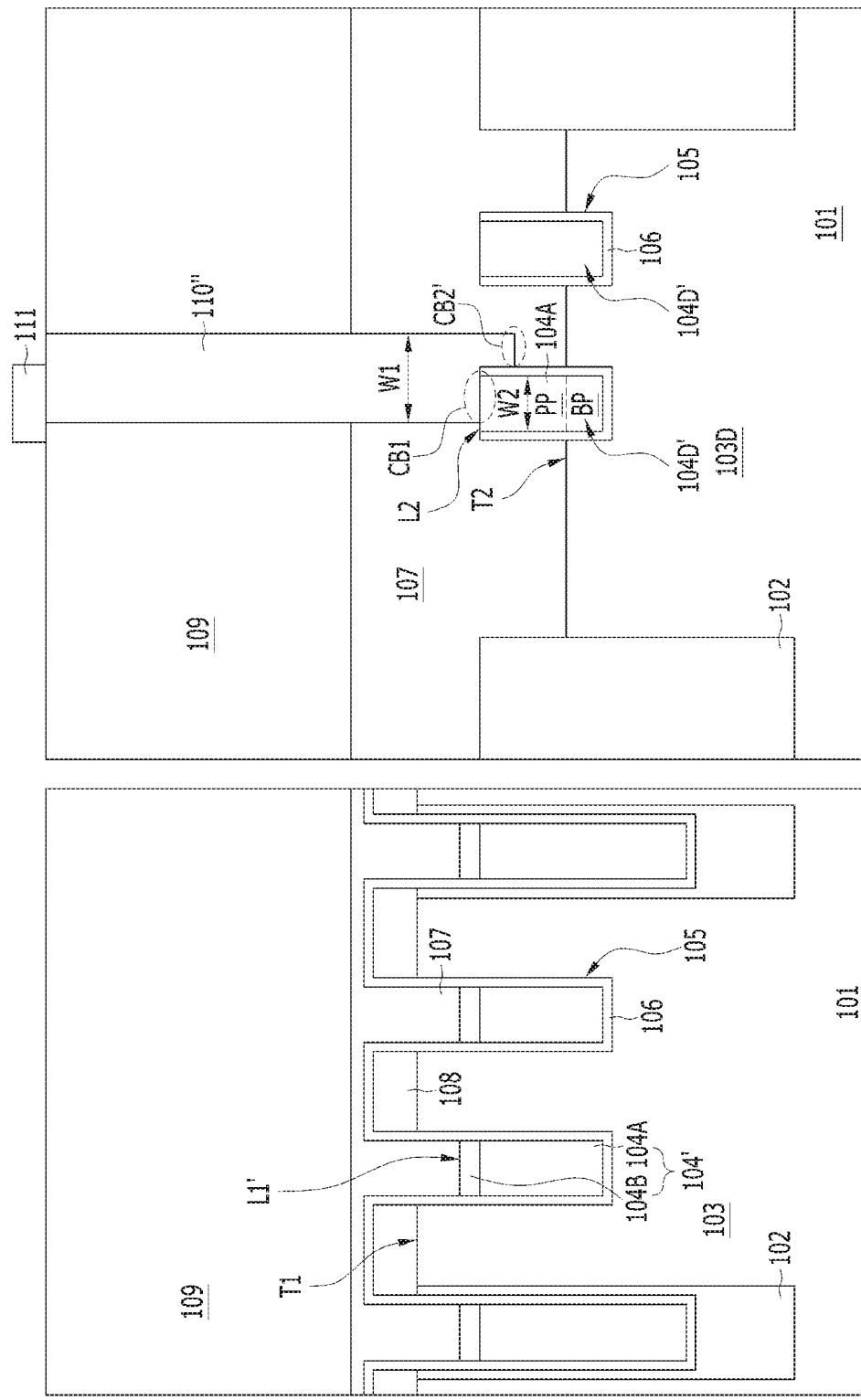
FIG. 5 is a cross-sectional view of a semiconductor device in accordance with another embodiment of the present invention.

FIG. 5 is a cross-sectional view of a semiconductor device in accordance with another embodiment of the present invention. The semiconductor device of FIG. 5 may include some similar elements to the semiconductor devices illustrated in FIGS. 3 and 4. Hereinafter, a detailed description of any overlapping constituent elements may be omitted.

Referring to FIG. 5, a buried word line 104' crossing the active region 103 may include a stack of a metal-based material 104A and a semiconductor material 104B. An edge portion 104D' of the buried word line 104' may also include the metal-based material 104A. The buried portion BP and the protruding portion PP, which form the edge portion 104D' of the buried word line 104' crossing the dummy active region 103D' may be all formed of the metal-based material 104A.

A contact plug 110" may be coupled to the edge portion 104D' of the buried word line 104'. The width W1 of the contact plug 110" may be greater than the width W2 of the edge portion 104D' of the buried word line 104'.

The bottom portion of the contact plug 110" may include a first portion CB1 overlapping with the edge portion 104D' of the buried word line 104' and a second portion CB2' overlapping with the capping layer 107. The second portion CB2' of the contact plug 110" may overlap with one sidewall of the protruding portion PP. The contact plug 110" may be in direct contact with the upper surface of the protruding portion PP of the edge portion 104D' and may also be in direct contact with an upper part of the gate dielectric layer 106 that covers an upper part of one of the sidewalls of the protruding portion PP of the edge part 104D'. The buried word line 104' is fully buried within the active region 103 and only partially buried in the dummy active region 103D.

FIGS. 6A to 6H are cross-sectional views illustrating a method for fabricating a semiconductor device in accordance with an embodiment of the present invention. FIGS. 6A to 6H illustrate an example of a method for fabricating the semiconductor device shown in FIG. 3.

Figure 6A:
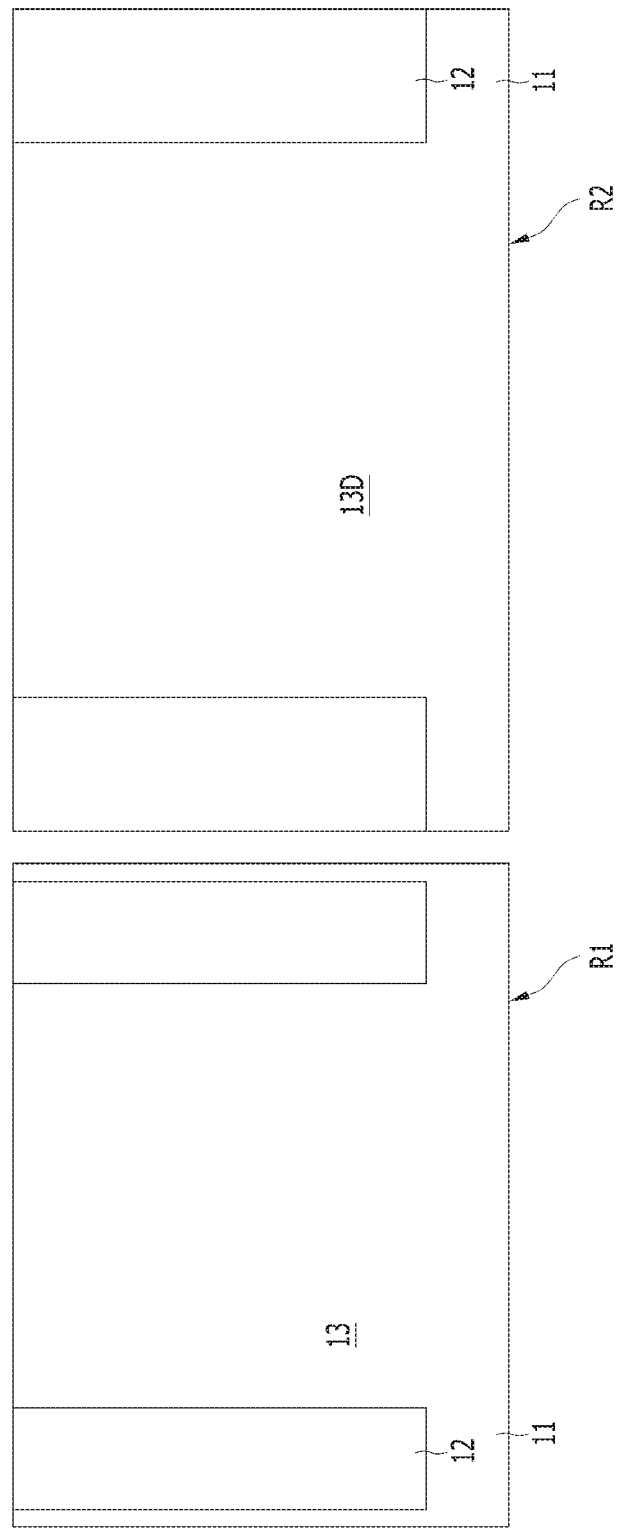

Referring to FIG. 6A, an isolation layer 12 may be formed in a substrate 11. A plurality of active regions 1 may be defined by the isolation layer 12. The isolation layer 12 may be formed by a Shallow Trench Isolation (STI) process. For example, the substrate 11 may be etched to form an isolation trench (not shown). The isolation trench may be filled with a dielectric material to form the isolation layer 12. The isolation layer 12 may include silicon oxide, silicon nitride, or a combination thereof. A Chemical Vapor Deposition (CVD) process or other deposition processes may be used to fill the isolation trench with a dielectric material. A planarization process such as chemical-mechanical polishing (CMP) may additionally be used. Each of the active regions 13 may have the same shape. From the perspective of a top view, the individual active regions 13 may have an island-shape surrounded by the isolation layer 12. The individual active regions 13 may extend in a diagonal direction. The individual active regions 13 may have a long axis and a short axis. The length of the long axis may be greater than the length of the short axis.

The substrate 11 may include a first region R1 and a second region R2. The active regions 13 may be formed in the first region R1. A plurality of dummy active regions 13D may be formed in the second region R2. The dummy active regions 13D and the active regions 13 may have different sizes. The dummy active regions 13D may have the same length or different lengths. The individual dummy active regions 13D may have a line shape extending along a diagonal direction. The individual dummy active regions 13D may be greater than the individual active regions 13. For example, the individual dummy active regions 13D and the individual active regions 13 may extend in the same direction, but the individual dummy active regions 13D may extend longer than the individual active regions 13. As described above, the dummy active regions 13D may have a line shape that is a longer elongated shape (relative to the active regions 13), while the active regions 13 may have a shorter elongated shape (relative to the dummy active regions 13D) referred to as an island shape. As will be described later, the individual active regions 13 may have a size that is sufficiently large that two word lines are placed therein, and the individual dummy active regions 13D may have a size that is sufficiently large that at least three word lines are placed therein. In some embodiments, two word lines may be disposed in the individual dummy active regions 13D, but in this case, too, the individual dummy active regions 13D may be greater than the individual active regions 13.

Figure 6B:
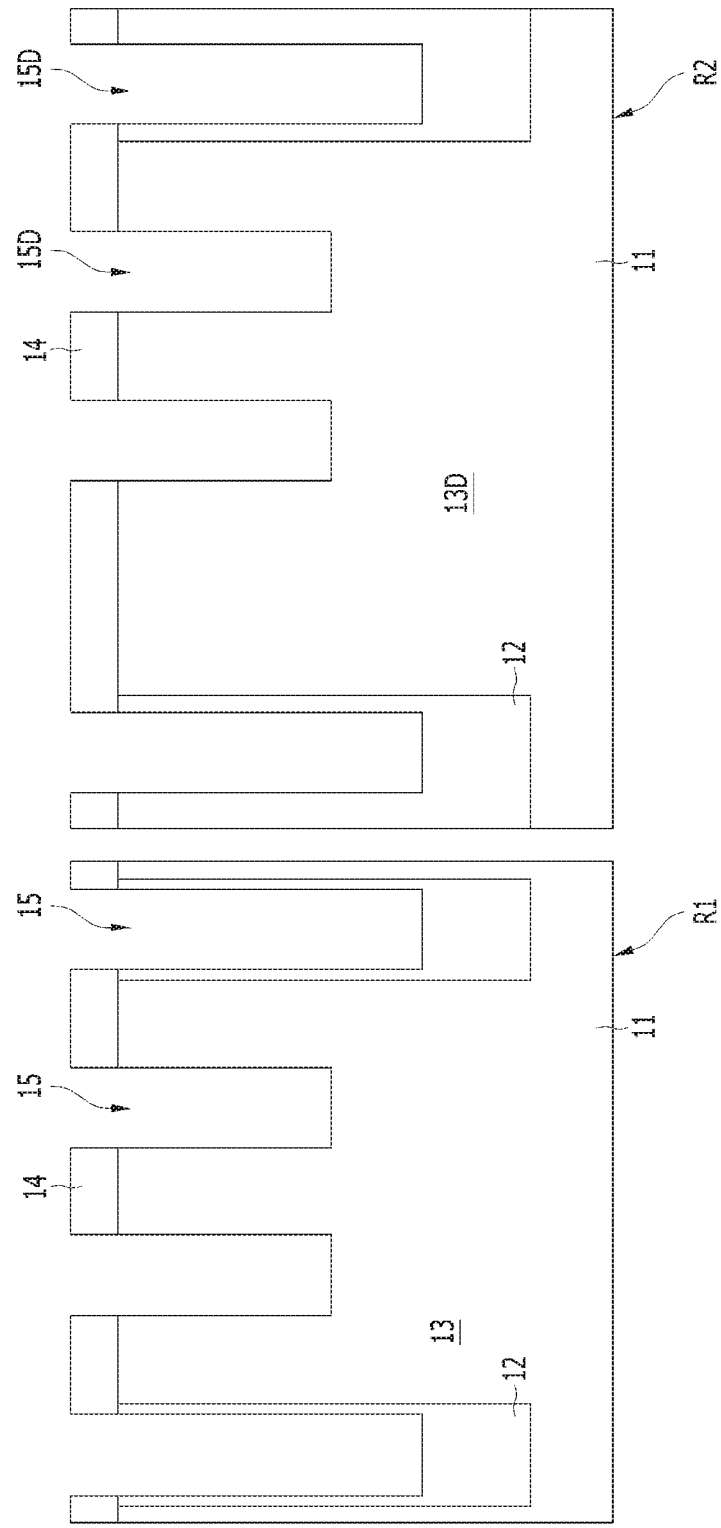

Referring to FIG. 6B, a plurality of trenches 15 may be formed in the substrate 11. The trenches 15 may be formed in a line shape traversing the active region 13 and the isolation layer 12. The trenches 15 may be formed by an etching process of the substrate 11 using the hard mask layer 14 as an etching mask. The hard mask layer 14 may be formed over the substrate 11 and may have a plurality of line-shaped openings. The hard mask layer 14 may be formed of a material having an etch selectivity with respect to the substrate 11. For example, the hard mask layer 14 may be of silicon oxide such as Ultra Low Temperature Oxide (ULTO) or Tetra-Ethyl-Ortho-Silicate (TEOS). The trenches 15 may be formed to have a depth that is shallower than the bottom surface of the isolation layer 12. The trenches 15 may have a depth sufficient to increase the average cross-sectional area of the word line which is to be formed subsequently. As a result, the resistance of the word line may be reduced. The bottom edge of the trenches 15 as shown in FIG. 6B are flat. However, the bottom edge of the trenches 15 according to another embodiment of the present invention (not shown) may have a curvature. The neighboring trenches 15 may be parallel to each other by being spaced apart from each other.

Although not illustrated, a fin region (not shown) may be formed after the trenches 15 are formed. In order to form the fin region, the isolation layer 12 below the trenches 15 may be selectively recessed. As a result, the active region 13 below the trenches 15 may include a fin region that is positioned at a higher level than the recessed isolation layer 12.

The trenches 15 may be formed in the first region R1. The trenches 15 may each include a trench edge portion 15D positioned in the second region R2. The trench edge portion 15D may be formed by etching the dummy active regions 13D and the isolation layer 12.

The trenches 15 positioned in the isolation layer 12 may be deeper than the trenches 15 positioned in the active region 13 and the dummy active region 13D. The trench edge portion 15D may have an elongated shape extending in a direction crossing the dummy active regions 13D.

Figure 6C:
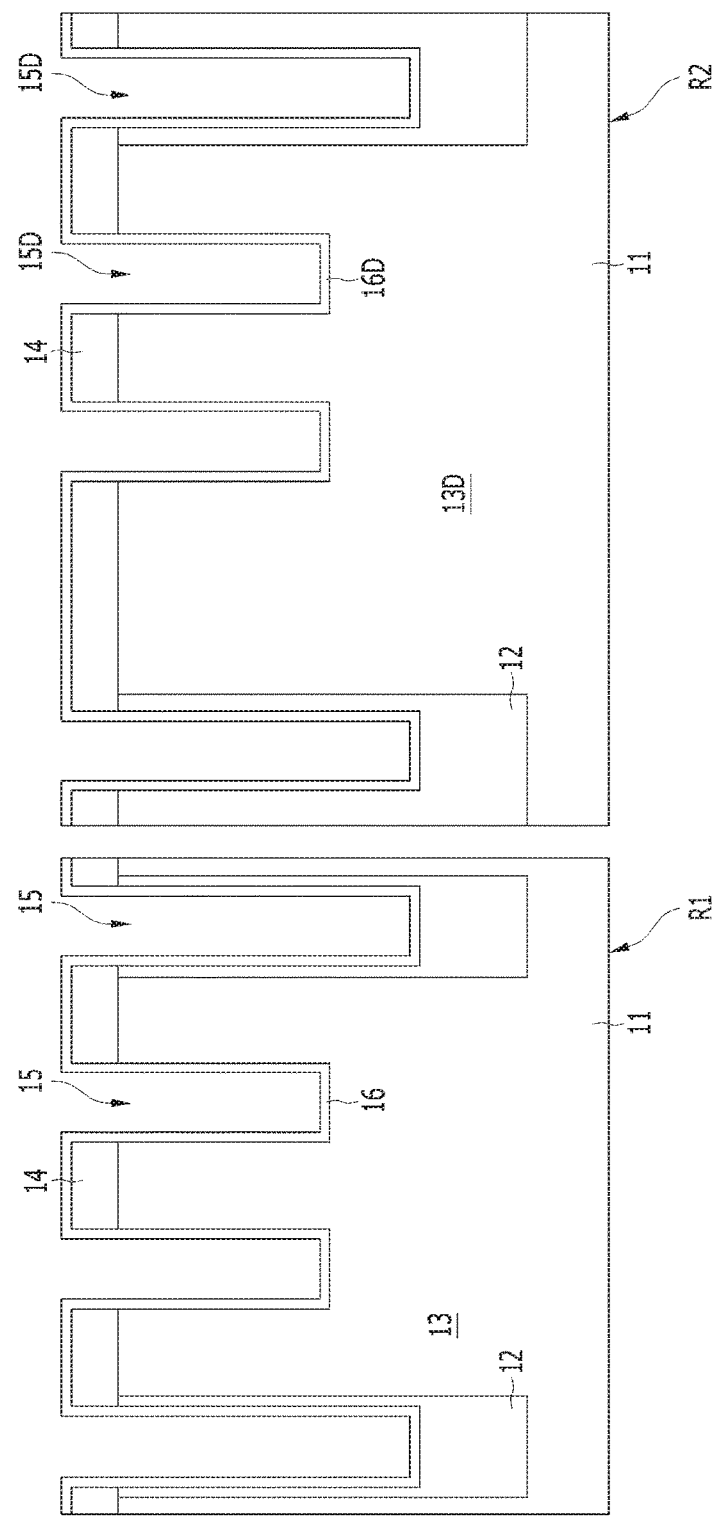

Referring to FIG. 6C, a gate dielectric layer 16 may be formed on the surface of the trenches 15. Before the gate dielectric layer 16 is formed, etch damage on the surface of the trenches 15 may be cured. For example, after a sacrificial oxide is formed by a thermal oxidation treatment, the sacrificial oxide may be removed. For example, the gate dielectric layer 16 may include silicon oxide.

The gate dielectric layer 16 may be formed, for example, by a chemical vapor deposition (CVD) process or an atomic layer deposition (ALD) process. The gate dielectric layer 16 formed by the deposition method may include, for example, a high-k material, silicon oxide, silicon nitride, silicon oxynitride, or a combination thereof. The high-k material may include, for example, a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, or combinations thereof. As for the high-k material, other known high-k materials may be selectively used. The gate dielectric layer 16 may include a stack of silicon oxide and a high-k material, where the high-k material may include a material having a higher oxygen atom surface density than silicon oxide.

According to another embodiment of the present invention, the gate dielectric layer 16 may be formed by a thermal oxidation process.

According to another embodiment of the present invention, the gate dielectric layer 16 may be formed by sequentially performing an ULTO deposition process and a high temperature oxidation process. The ULTO deposition process may refer to the deposition of an ultra low temperature silicon oxide. The ultra low temperature silicon oxide (ULTO) may be deposited at a temperature of approximately 400° C. The high temperature oxidation process may be an oxidation process performed at a temperature of approximately 1050° C. after the deposition of the ultra low temperature silicon oxide (ULTO). As described above, a decrease in the critical dimension of the active region 13 may be suppressed by the combination of the ULTO deposition process and the high temperature oxidation process.

A gate dielectric layer edge portion 16D may be formed over the trench edge portion 15D. The gate dielectric layer edge portion 16D may be a portion of the gate dielectric layer 16 and may refer to the gate dielectric layer 16 positioned in the second region R2. The gate dielectric layer edge portion 16D may be formed simultaneously with the formation of the gate dielectric layer 16. The gate dielectric layer edge portion 16D and the gate dielectric layer 16 may be formed of the same material. The gate dielectric layer edge portion 16D and the gate dielectric layer 16 may have the same thickness.

Figure 6D:
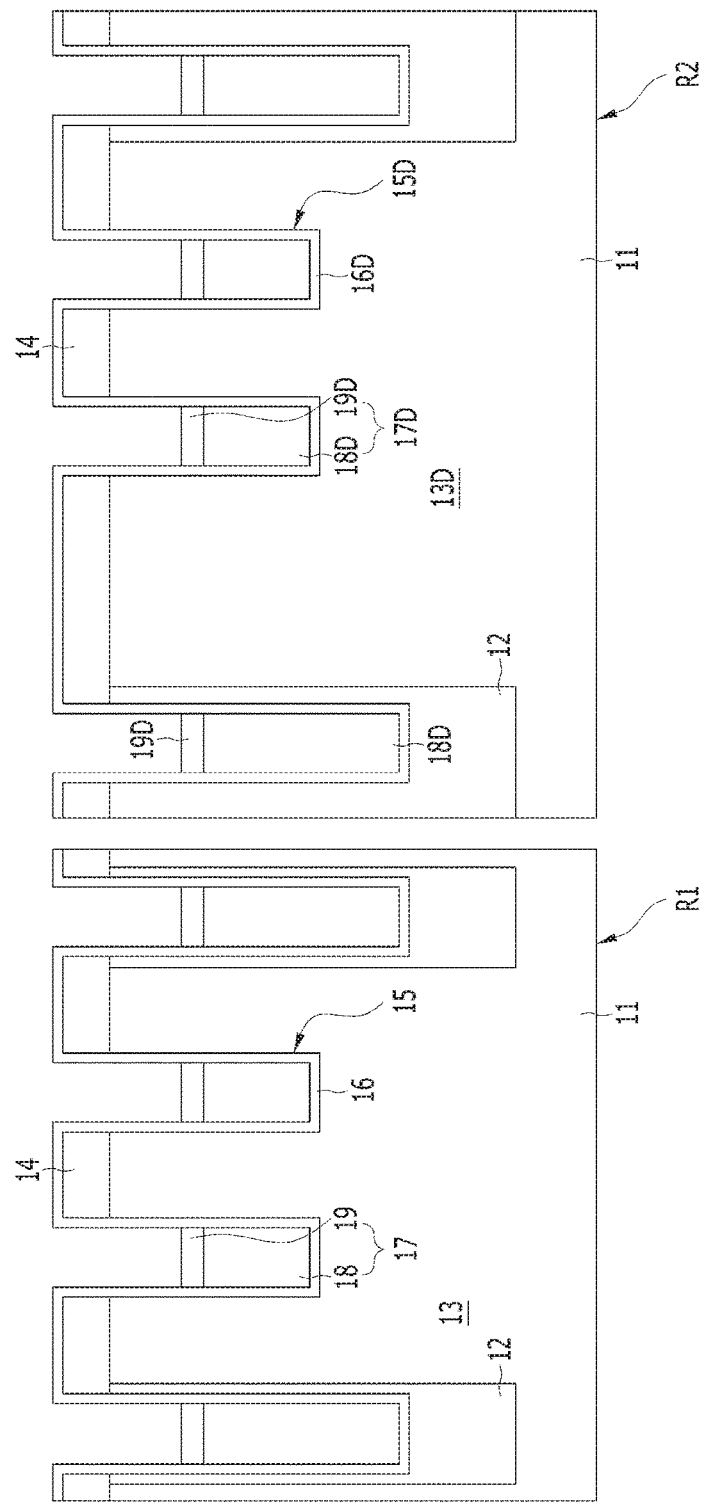

Referring to FIG. 6D, a word line 17 may be formed. The word line 17 may partially fill a trench 15 over the gate dielectric layer 16. The word line 17 may be referred to as a buried word line. The word line 17 may include a lower gate layer 18 and an upper gate layer 19. The upper gate layer 19 may be formed over the lower gate layer 18. The upper surface of the upper gate layer 19 may be positioned at a lower level than the upper surface of the hard mask layer 14.

The lower gate layer 18 may fill the bottom portion of the trench 15 over the gate dielectric layer 16. The lower gate layer 18 may include a low-resistance metal material. The lower gate layer 18 may include, for example, tungsten. The lower gate layer 18 may be formed, for example, by a chemical vapor deposition (CVD) process or an atomic layer deposition (ALD) process. According to another embodiment of the present invention, the lower gate layer 18 may include a high work function material. For example, the lower gate layer 18 may include a high work function metal or a high work function polysilicon. The high work function polysilicon may include, for example, P-type polysilicon. The high work function metal may include, for example, nitrogen-rich titanium nitride (TiN). To form the lower gate layer 18, a recessing process of a lower gate material may be performed after the trench 15 is gap-filled with the lower gate material (not shown). The recessing process may be performed by a dry etching process, for example, an etch-back process. The etch-back process may be performed using plasma. The lower gate layer 18 may be formed by an etch-back process of the lower gate material. According to another embodiment of the present invention, the recessing process may be performed by performing a planarization process first to expose the upper surface of the hard mask layer 14 and then performing an etch-back process subsequently. The upper surface of the lower gate layer 18 may be recessed to be lower than the upper surface of the active region 13.

In order to form the upper gate layer 19, after an upper gate material (not shown) is deposited to fill the trench 15 over the lower gate layer 18, a recessing process of the upper gate material may be performed. The upper gate material may be formed, for example, by a chemical vapor deposition (CVD) process or an atomic layer deposition (ALD) process. The recessing process of the upper gate material may be performed by a dry etching process, for example, an etch-back process. The upper gate layer 19 may be formed by an etch-back process of the upper gate material. According to another embodiment of the present invention, the recessing process of the upper gate material may be performed by performing a planarization process to expose the upper surface of the hard mask layer 14 and then performing an etch-back process subsequently. The upper surface of the upper gate layer 19 may be positioned at a lower level than the upper surface of the active region 13.

The upper gate layer 19 may have a lower work function than the lower gate layer 18. The upper gate layer 19 may have a smaller work function than a mid-gap work function of silicon. The upper gate layer 19 may be referred to as a low work function gate layer. The upper gate layer 19 may include a low work function metal or a low work function polysilicon. The low work function polysilicon may include, for example, N-type polysilicon. The low work function metal may include, for example, titanium-rich titanium nitride (TiN). In this embodiment of the present invention, the upper gate layer 19 may be polysilicon doped with an N-type impurity.

The word line 17 formed in the first region R1 may extend to be positioned in the second region R2. The word line 17 may include a word line edge portion 17D positioned in the second region R2. The word line edge portion 17D may partially fill the trench edge portion 15D over the gate dielectric layer edge portion 16D. The word line edge portion 17D and the word line 17 may be formed at the same time. The word line edge portion 17D and the word line 17 may be made of the same material. The word line edge portion 17D and the word line 17 may have the same height. The word line edge portion 17D may include a lower gate layer edge portion 18D and an upper gate layer edge portion 19D positioned over the lower gate layer edge portion 18D. The lower gate layer edge portion 18D may be a portion of the lower gate layer 18 and may refer to the lower gate layer 18 positioned in the second region R2. The upper gate layer edge portion 19D may be a portion of the upper gate layer 19 and may refer to the upper gate layer 19 positioned in the second region R2. The word line edge portion 17D may correspond to the edge portions 104D and 104D' of the buried word line 104 shown in FIGS. 1 to 5.

The word line 17 positioned in the isolation layer 12 may be deeper than the word line 17 positioned in the active region 13 and the dummy active region 13D. The word line edge portion 17D may have an elongated shape extending in a direction crossing the dummy active regions 13D.

Referring to FIG. 6E, a mask layer 20 may be formed. The mask layer 20 may be formed in the first region R1. The mask layer 20 may include a photoresist pattern or a hard mask material. The second region R2 may be exposed by the mask layer 20. The mask layer 20 may expose an etch target portion 22 of the second region R2. The etch target portion 22 may refer to a structure having a higher level than the bottom surface of the lower gate layer edge portion 18D.

An etching process using the mask layer 20 may be performed, and the etch target portion 22 may be removed by the etching process. For example, the hard mask layer 14, the upper gate layer edge portion 19D, a portion of the gate dielectric layer edge portion 16D, and a portion of the isolation layer 12 may be etched. Through the etching process of the etch target portion 22, an isolation layer 12' with a lowered height and a gate dielectric layer edge portion 16D' with a lowered height may be formed in the second region R2. As the upper gate layer edge portion 19D is removed, the lower gate layer edge portion 18D may remain in the second region R2. The lower gate layer edge portion 18D may fill the trench edge portion 15D' with a lowered height.

Additionally, the etching process using the mask layer 20 may etch a portion of the dummy active region 13D. As a result, a dummy active region 13D' with a lowered height may be formed. The dummy active region 13D' with a lowered height may be simply referred to as a recessed dummy active region 13D'.

The upper surface 21 of the recessed dummy active region 13D' may be positioned at a lower level than the upper surface L1 of the lower gate layer edge portion 18D, and the upper surface 21 of the recessed dummy active region 13D' may be positioned at a higher level than the bottom surface L2 of the lower gate layer edge portion 18D. The gate dielectric layer edge portion 16D' may cover the bottom surface and the sidewalls of the lower gate layer edge portion 18D. The upper surface of the gate dielectric layer edge portion 16D' and the upper surface of the lower gate layer edge portion 18D may be positioned at the same level.

As described above, in order to recess the dummy active region 13D', the dummy active region 13D' may be selectively etched with respect to the lower gate layer edge portion 18D.

Figure 6F:
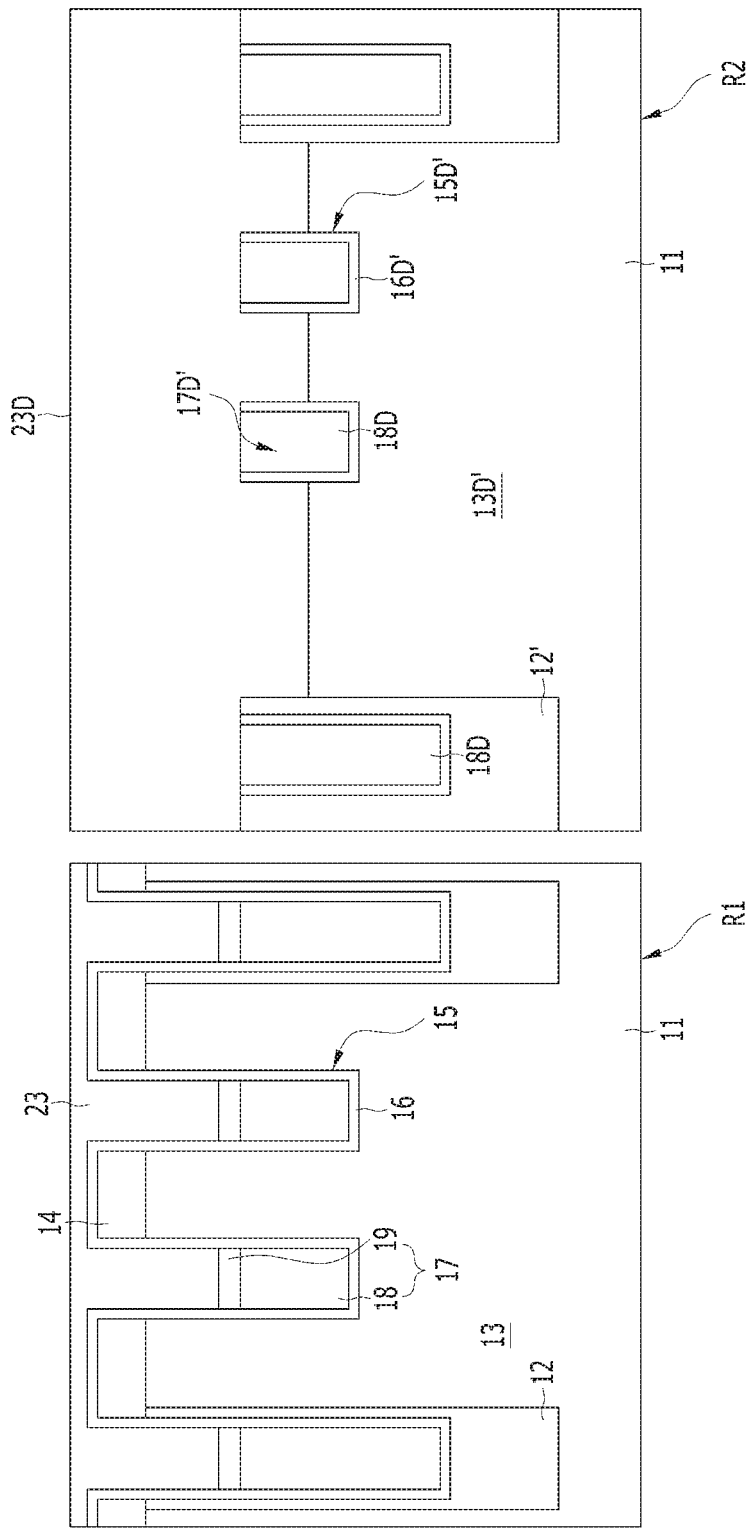

Referring to FIG. 6F, after the mask layer 20 is removed, a capping layer 23 may be formed. The capping layer 23 may include a dielectric material. For example, the capping layer 23 may include silicon nitride. In an embodiment, the capping layer 23 may have an oxide-nitride-oxide (ONO) structure.

The capping layer 23 may be formed in both the first region R1 and the second region R2. The capping layer 23 formed in the second region R2 may be simply referred to as a capping layer edge portion 23D. The capping layer edge portion 23D may cover the upper surface of the recessed dummy active region 13D'. The capping layer edge portion 23D may cover the upper surface of the lower gate layer edge portion 18D. The capping layer edge portion 23D may cover a portion of the sidewalls of the gate dielectric layer edge portion 16D'. The capping layer edge portion 23D may cover the upper surface and a portion of the sidewalls of the isolation layer 12'.

The capping layer 23 formed in the first region R1 may directly contact the upper gate layer 19. The capping layer edge portion 23D formed in the second region R2 may directly contact the lower gate layer edge portion 18D.

As described above, the capping layer edge portion 23D may be filled in the second region R2 between the neighboring lower gate layer edge portions 18D.

Figure 6G:
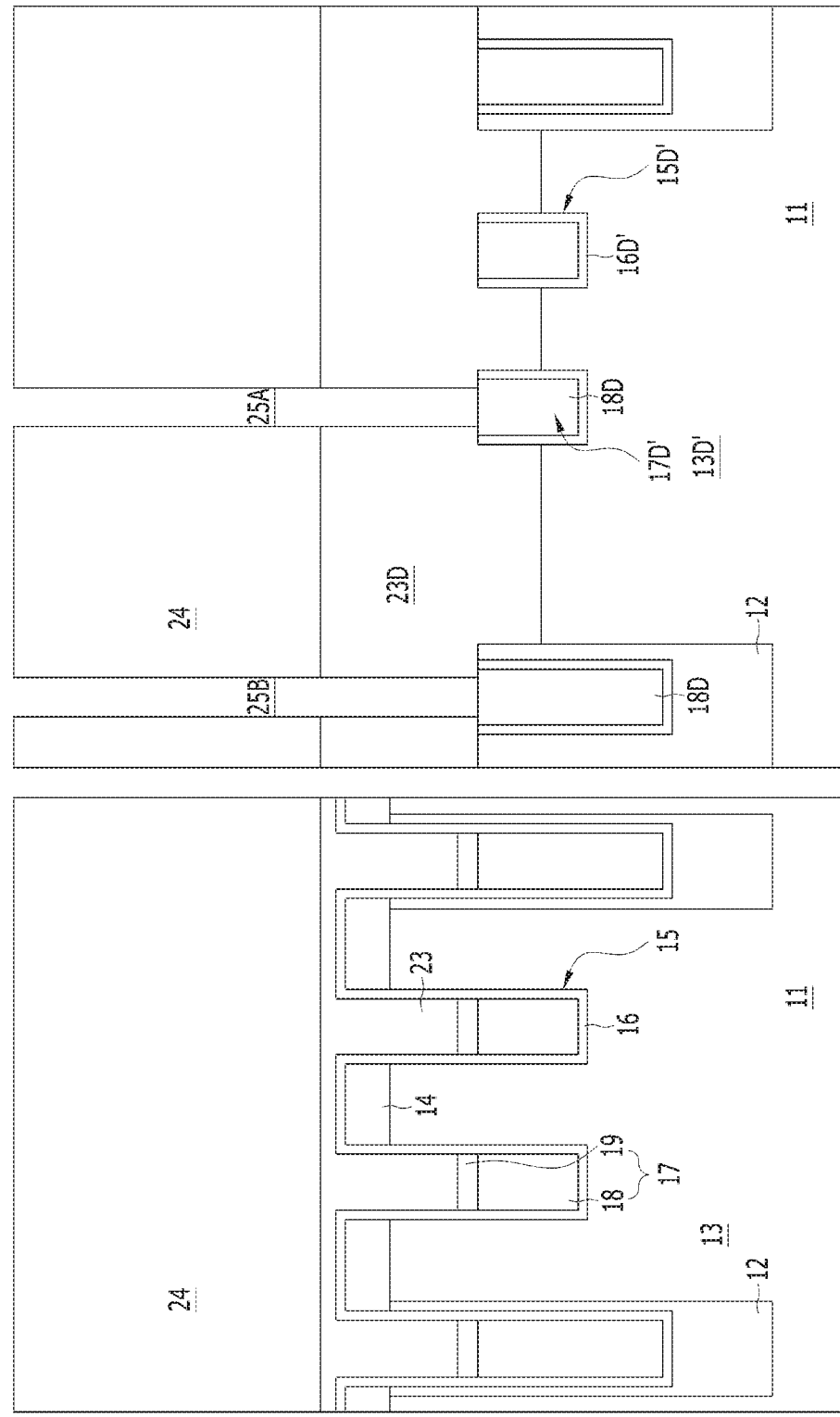

Referring to FIG. 6G, an inter-layer dielectric layer 24 may be formed over the capping layer 23. For example, the inter-layer dielectric layer 24 may include silicon oxide.

Subsequently, one or more contact holes 25A and 25B may be formed by etching the inter-layer dielectric layer 24 and the capping layer edge portion 23D. The contact holes 25A and 25B may be formed in the second region R2. The contact holes 25A and 25B may land on the upper surface of the lower gate layer edge portion 18D. The contact hole 25A may land on the upper surface of the lower gate layer edge portion 18D crossing the recessed dummy active region 13D'. The contact hole 25B may land on the upper surface of the lower gate layer edge portion 18D buried in the isolation layer 12'.

Figure 6H:
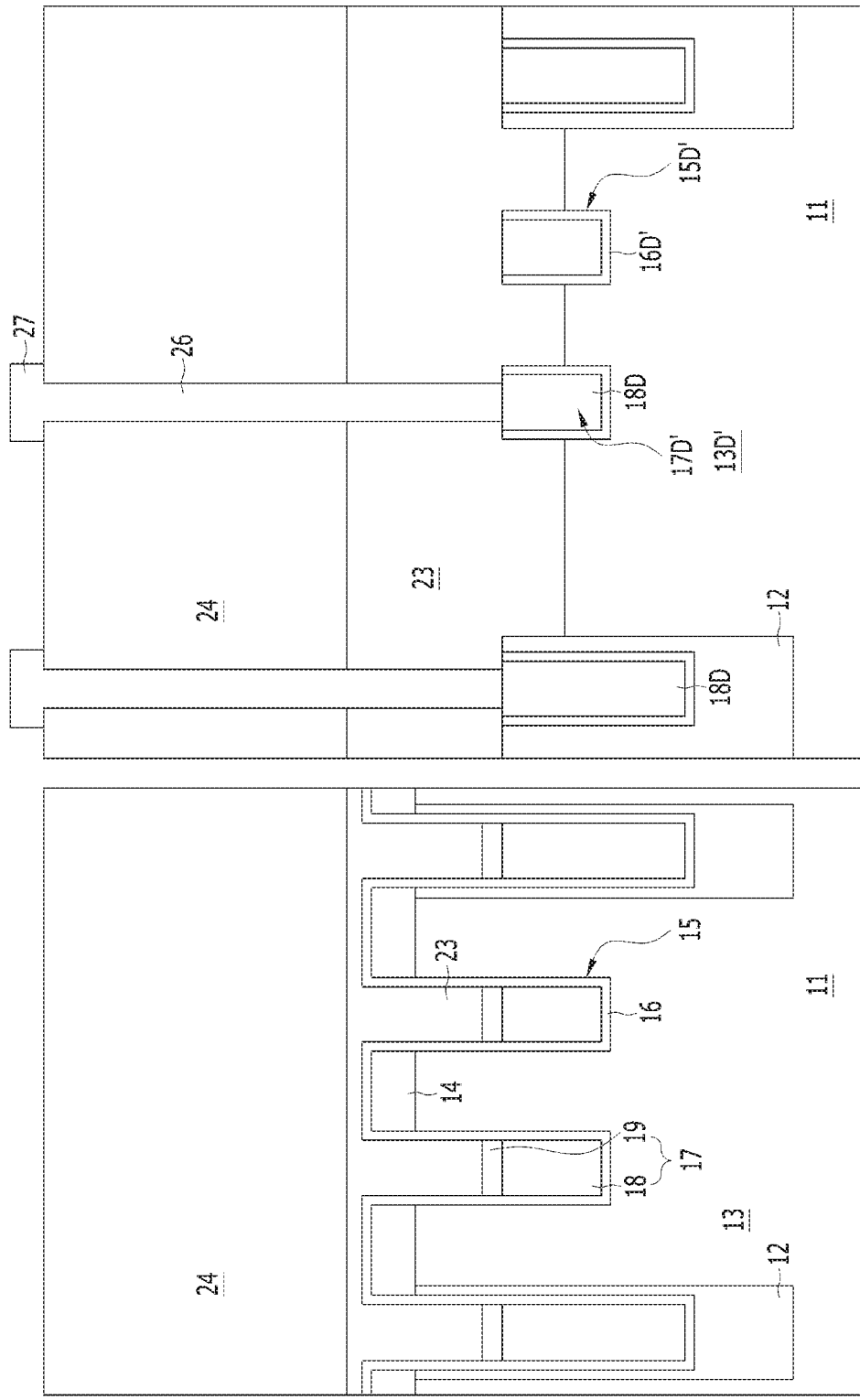

Referring to FIG. 6H, a metal wire 27 may be formed which is coupled to the lower gate layer edge portion 18D through the contact holes 25A and 25B. The metal wire 27 may be electrically connected to the lower gate layer edge portion 18D through the contact plug 26. The contact plug 26 may fill the contact holes 25A and 25B.

According to the above-described embodiment of the present invention, by forming the dummy active region 13D' long, bending of the word line 17 may be suppressed.

Since the height of the dummy active region 13D' is lowered by using the mask layer 20, the physical distance between the contact holes 25A and 25B and the dummy active region 13D' may be increased. Accordingly, a short circuit between the contact holes 25A and 25B and the dummy active region 13D' may be prevented. Since the capping layer edge portion 23D between the lower gate layer edge portions 18D is gap-filled the space, short circuits between the contact holes 25A and 256 and the dummy active region 13D' may be further prevented. Since the capping layer edge portion 23D between the neighboring lower gate layer edge portions 18D is gap-filled, widening of the contact holes 25A and 25B may also be suppressed.

As a comparative example, when the dummy active regions 13 and 13D' are omitted, only the isolation layer 12 may be formed in the second region R2. Accordingly, bending of the edge portion of the word line 17 to which the contact plug 26 is coupled may be caused by the stress induced from the isolation layer 12. The bending of the word line may result in a short circuit between the neighboring word lines. In contrast, in this embodiment of the present invention, even though the word line edge portion 17D' is subjected to the stress induced from the isolation layer 12, the dummy active region 13D' may be able to support the word line edge portion 17D' so as to suppress the bending of the word line edge portion 17D'.

As a comparative example, when the capping layer edge portion 23D is not gap-filled between the neighboring lower gate layer edge portion 18D, a short circuit between the contact holes 25A and 25B and the neighboring word line edge portion 17D may occur. In contrast, in this embodiment of the present invention, the capping layer edge portion 23D between the neighboring lower gate layer edge portions 18D is gap-filled. Therefore, even though the critical dimensions of the bottom portions of the contact holes 25A and 25B increase, a short circuit with the neighboring word line edge portion 17D' may be suppressed.

FIGS. 7A to 7E are cross-sectional views illustrating a method for fabricating a semiconductor device in accordance with another embodiment of the present invention.

First, the gate dielectric layer 16 may be formed by a series of the processes illustrated in FIGS. 6A to 6C.

Figure 7A:
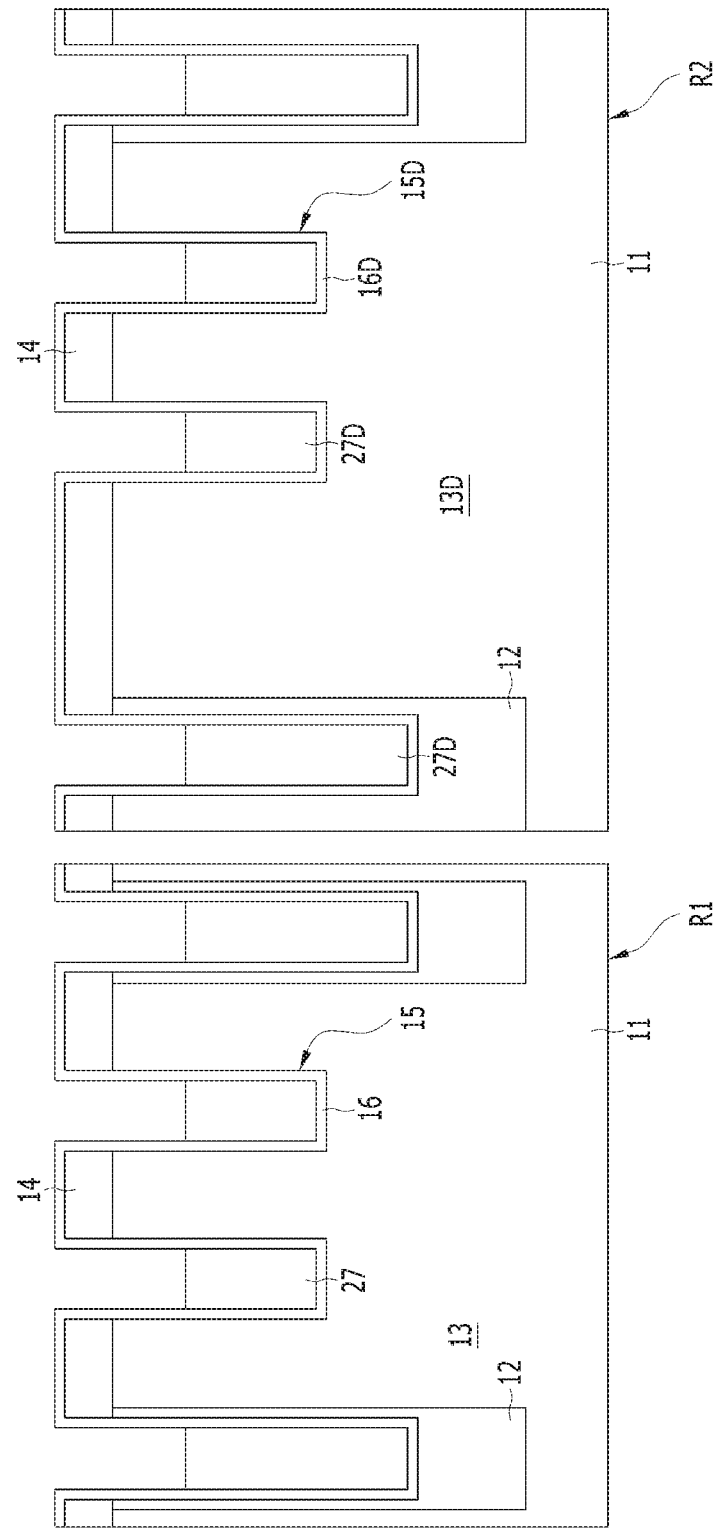
FIGS. 7A to 7E are cross-sectional views illustrating a method for fabricating a semiconductor device in accordance with another embodiment of the present invention.

Subsequently, as shown in FIG. 7A, a word line 27 may be formed. The word line 27 may partially fill the trench 15 over the gate dielectric layer 16. The word line 27 may be referred to as a buried word line. The word line 27 may include a single gate layer. The upper surface of the word line 27 may be positioned at a lower level than the upper surface of the hard mask layer 14.

The word line 27 may include a low-resistance metal material. The word line 27 may include, for example, tungsten. The word line 27 may include a high work function material. The word line 27 may include a high work function metal or a high work function polysilicon. The high work function polysilicon may include, for example, a P-type polysilicon. The high work function metal may include, for example, nitrogen-rich titanium nitride (TiN). To form the word line 27 the trench 15 may be gap-filled with a gate material (not shown) and then the gate material may be recessed. The recessing process may be performed by a dry etching process, for example, an etch-back process. The etch-back process may be performed using plasma. The word line 27 may be formed by an etch-back process of the gate material. According to another embodiment of the present invention, the recessing may be performed by performing a planarization process to expose the upper surface of the hard mask layer 14 and then performing an etch-back process. The upper surface of the word line 27 may be recessed to a level that is lower than the upper surface of the active region 13. In this embodiment of the present invention, the word line 27 may include a TiN/W stack.

The word line 27 formed in the first region R1 may extend to be positioned in the second region R2. The word line 27 may include a word line edge portion 27D positioned in the second region R2. The word line edge portion 27D may partially fill the trench edge portion 15D over the gate dielectric layer edge portion 16D. The word line edge portion 27D and the word line 27 may be formed at the same time. The word line edge portion 27D and the word line 27 may be made of the same material. The word line edge portion 27D and the word line 27 may have the same height.

The word line 27 positioned in the isolation layer 12 may be deeper than the word line 27 positioned in the active region 13 and the dummy active region 13D. The word line edge portion 27D may have an elongated shape extending in a direction crossing the dummy active regions 13D.

Figure 7B:
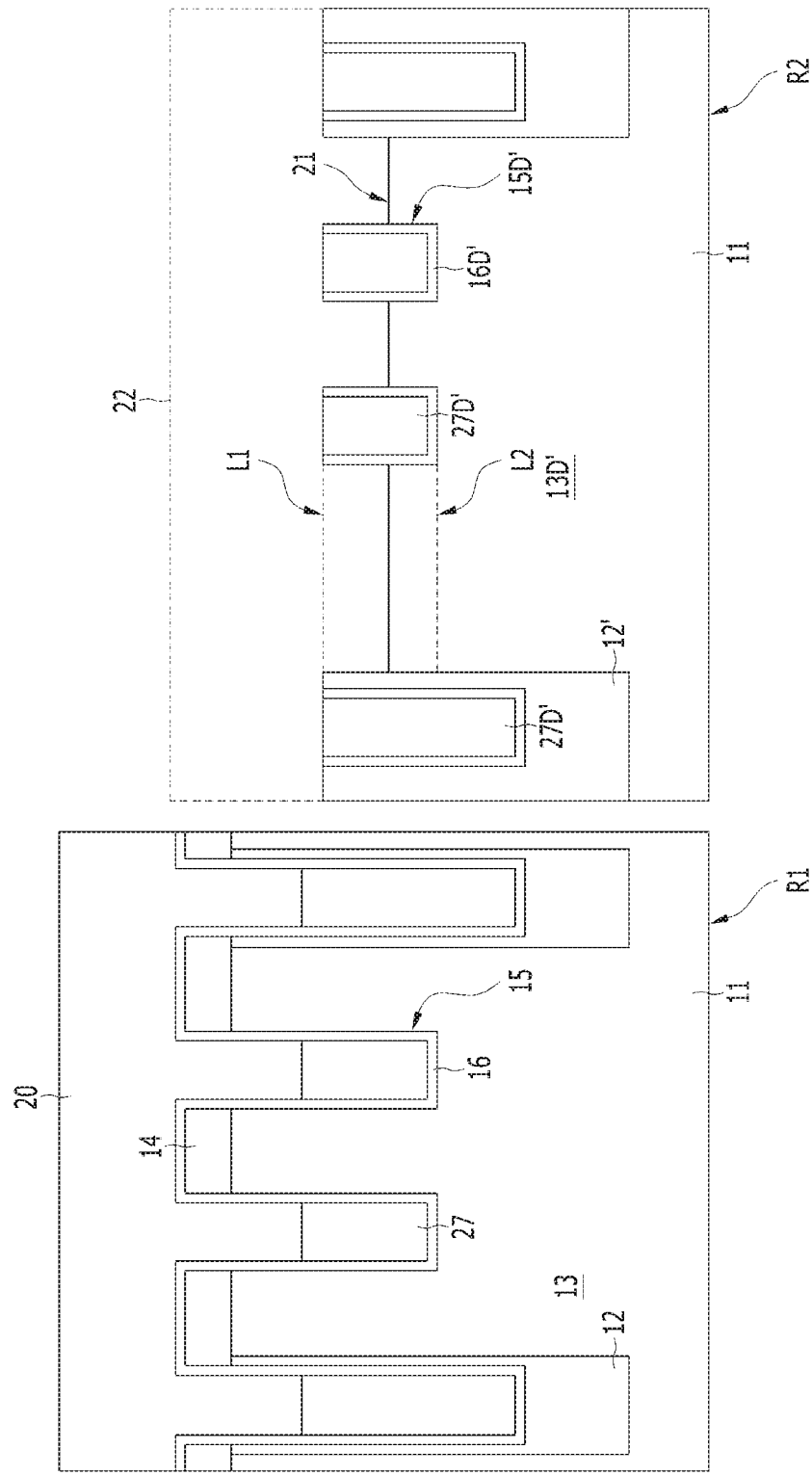

Referring to FIG. 7B, a mask layer 20 may be formed. The mask layer 20 may be formed in the first region R1. The mask layer 20 may include a photoresist pattern or a hard mask material. The second region R2 may be exposed by the mask layer 20. The mask layer 20 may expose the etch target portion 22 of the second region R2. The etch target portion 22 may refer to a structure positioned at a higher level than the upper surface of the word line edge portion 27D.

An etching process using the mask layer 20 may be performed, and the etch target portion 22 may be removed by the etching process. For example, the hard mask layer 14, a portion of the word line edge portion 27D, a portion of the gate dielectric layer edge portion 16D, and a portion of the isolation layer 12 may be etched. Through the etching process of the etch target portion 22, an isolation layer 12' with a lowered height and a gate dielectric layer edge portion 16D' with a lowered height may be formed in the second region R2. The word line edge portion 27D' with a lowered height may remain in the second region R2, as a portion of the word line edge portion 27D is removed. The word line edge portion 27D' may fill the trench edge portion 15D' with a lowered height.

Additionally, the etching process using the mask layer 20 may etch a portion of the dummy active region 13D. As a result, a dummy active region 13D' with a lowered height may be formed. The dummy active region 13D' with a lowered height may be simply referred to as a recessed dummy active region 13D'.

The upper surface 21 of the recessed dummy active region 13D' may be positioned at a lower level than the upper surface L1 of the word line edge portion 27D', and the upper surface 21 of the recessed dummy active region 13D' may be positioned at a higher level than the bottom surface L2 of the word line edge portion 27D'. The gate dielectric layer edge portion 16D' may cover the bottom surface and the sidewalls of the word line edge portion 27D'. The upper surface of the gate dielectric layer edge portion 16D' and the upper surface of the word line edge portion 27D' may be positioned at the same level.

The word line edge portion 27D' may have a lower upper surface than the word line 27.

Figure 7C:
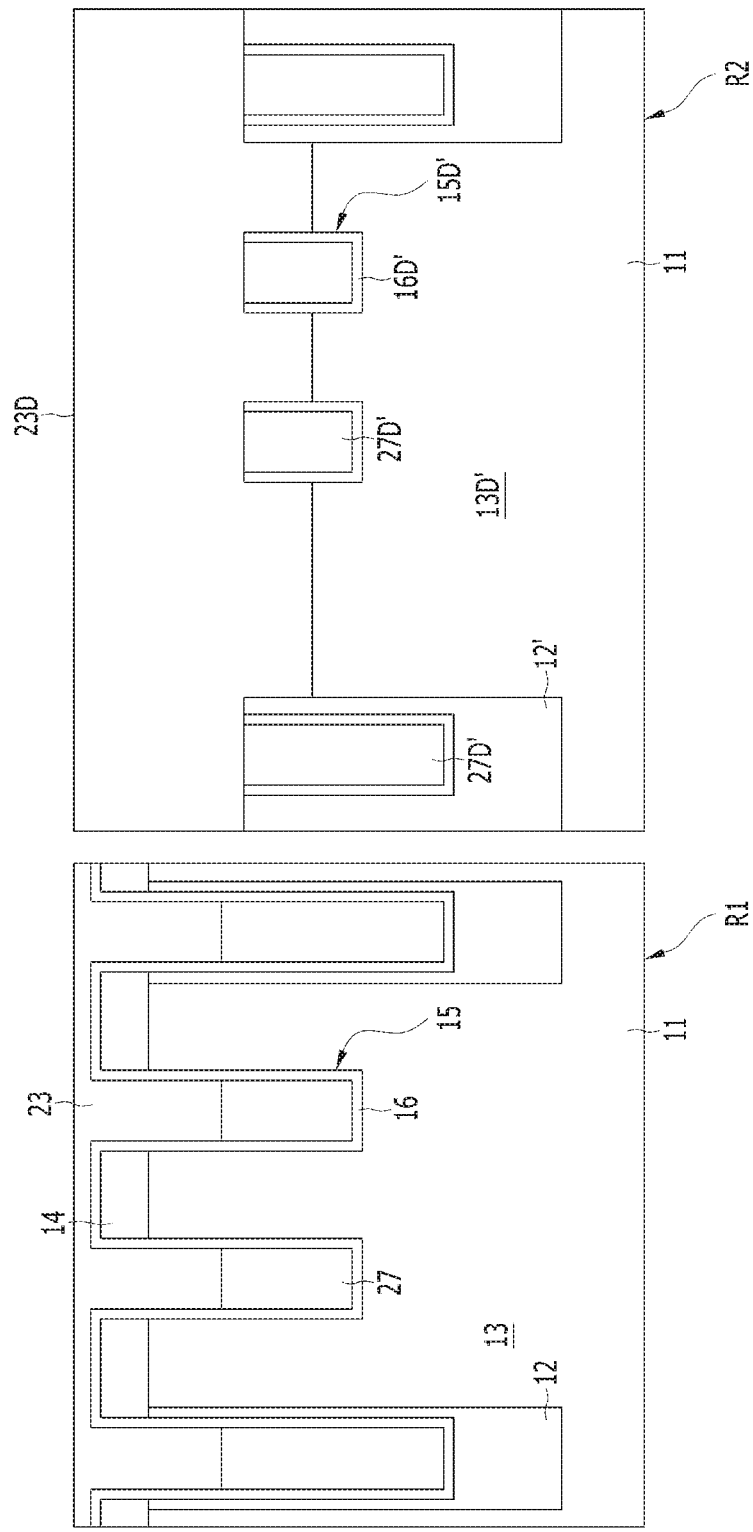

Referring to FIG. 7C, after the mask layer 20 is removed, a capping layer 23 may be formed. The capping layer 23 may include a dielectric material. The capping layer 23 may include silicon nitride. The capping layer 23 may have an oxide-nitride-oxide (ONO) structure.

The capping layer 23 may be formed in both of the first region R1 and the second region R2. The capping layer 23 formed in the second region R2 may be simply referred to as a capping layer edge portion 23D. The capping layer edge portion 23D may cover the upper surface of the recessed dummy active region 13D'. The capping layer edge portion 23D may cover the upper surface of the word line edge portion 27D'. The capping layer edge portion 23D may cover a portion of the sidewalls of the gate dielectric layer edge portion 16D'. The capping layer edge portion 23D may cover the upper surface and a portion of the sidewalls of the isolation layer 12'.

The capping layer 23 formed in the first region R1 may directly contact the word line 27. The capping layer edge portion 23D formed in the second region R2 may directly contact the word line edge portion 27D'.

As described above, in the second region R2, the capping layer edge portion 23D between the neighboring word line edge portions 27D' may be filled.

Figure 7D:
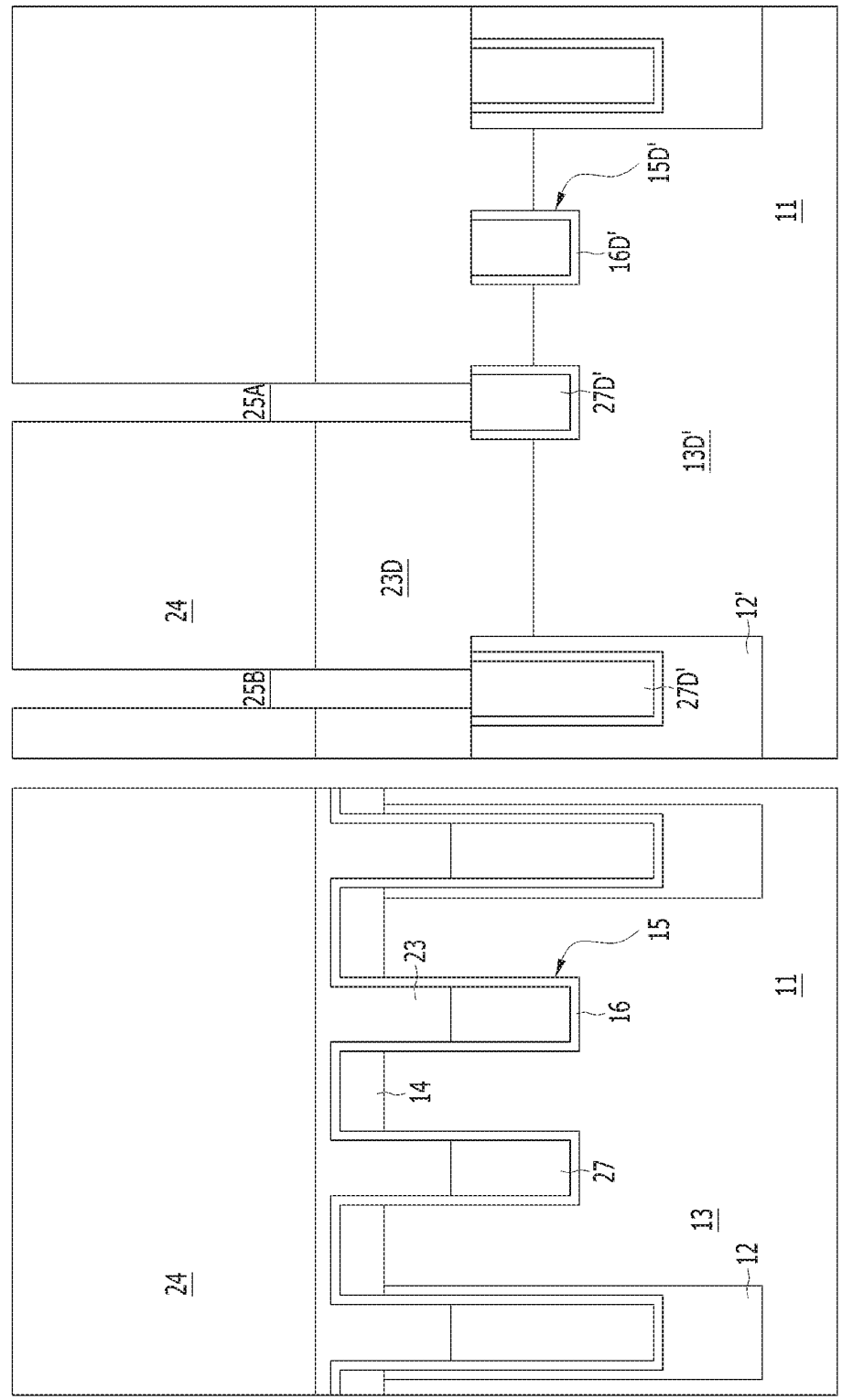

Referring to FIG. 7D, an inter-layer dielectric layer 24 may be formed over the capping layer 23. The inter-layer dielectric layer 24 may include silicon oxide.

Subsequently, one or more contact holes 25A and 25B may be formed by etching the inter-layer dielectric layer 24 and the capping layer edge portion 23D. The contact holes 25A and 25B may be formed in the second region R2. The contact holes 25A and 25B may land on the upper surface of the word line edge portion 27D'. The contact hole 25A may land on the upper surface of the word line edge portion 27D' crossing the recessed dummy active region 13D'. The contact hole 25B may land on the upper surface of the word line edge portion 27D' buried in the isolation layer 12'.

Figure 7E:
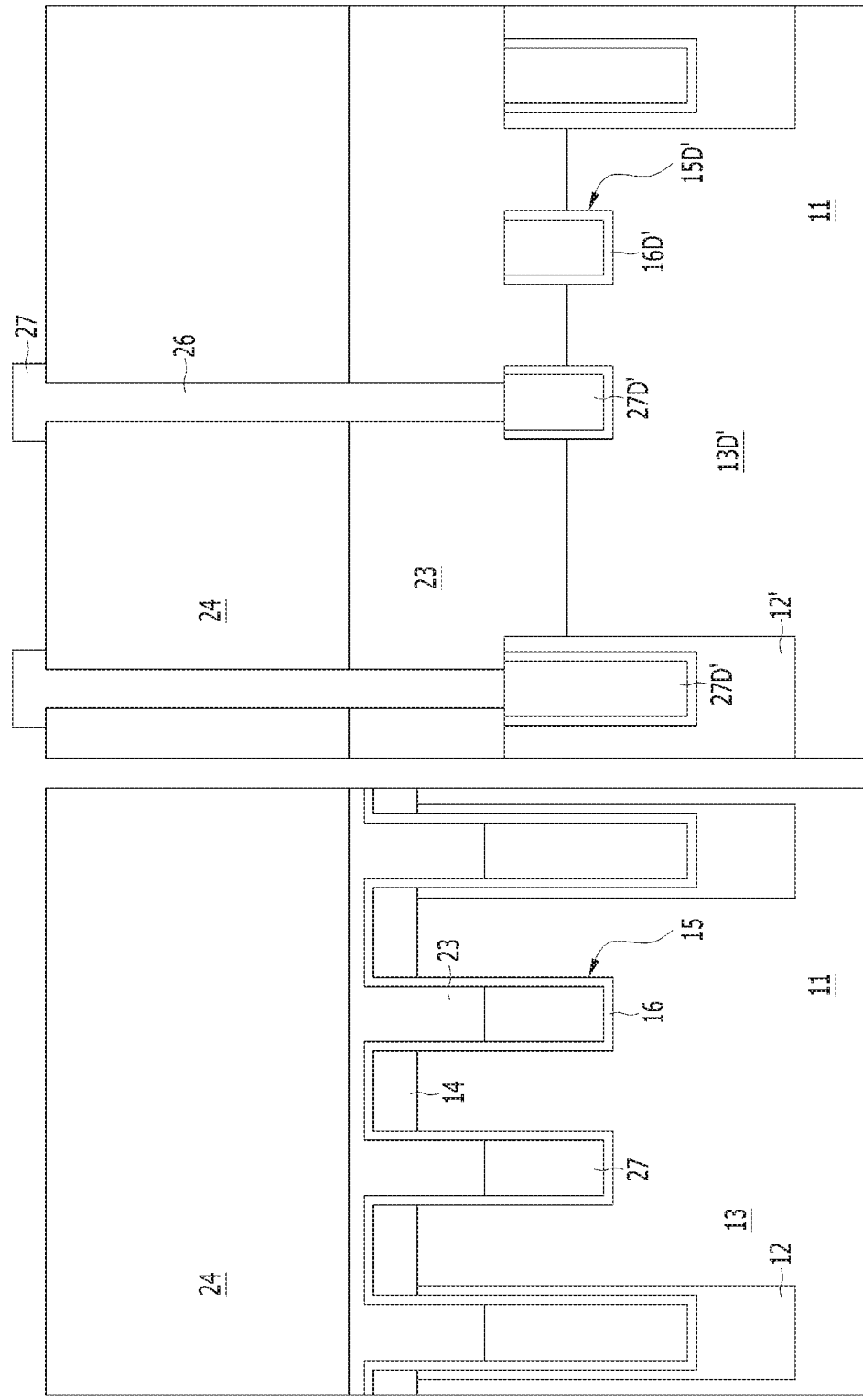

Referring to FIG. 7E, a metal wire 27 may be formed which is coupled to the word line edge portion 27D' through the contact holes 25A and 25B. The metal wire 27 may be electrically connected to the word line edge portion 27D' through the contact plug 26. The contact plug 26 may fill the contact holes 25A and 25G.

Figure 8:
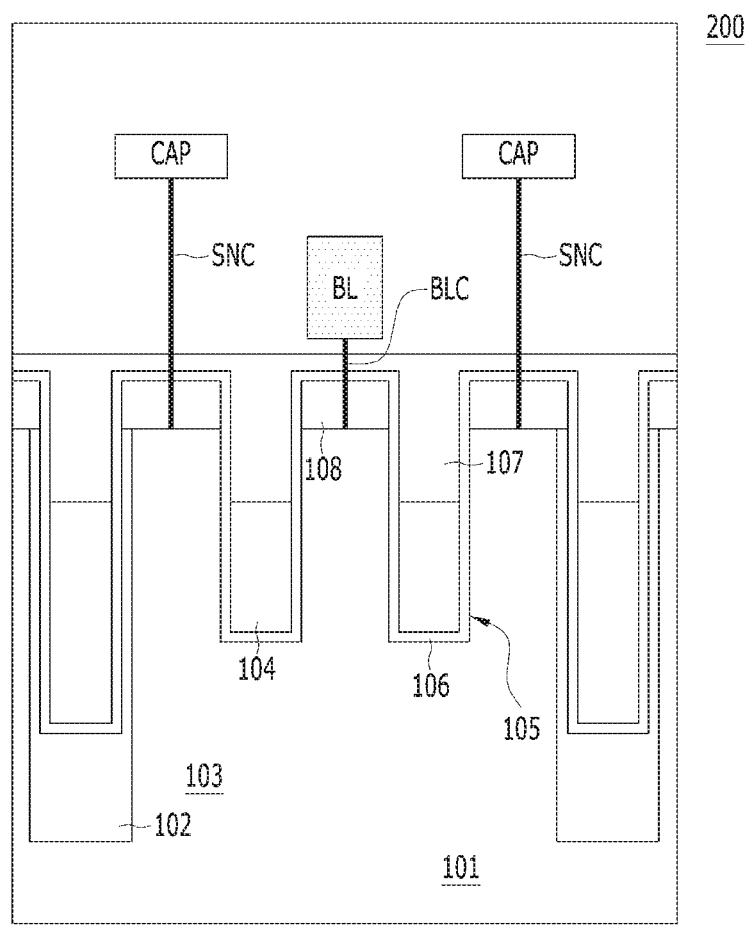
FIG. 8 is a cross-sectional view of a semiconductor device in accordance with another embodiment of the present invention.

FIG. 8 is a cross-sectional view of a semiconductor device 200 in accordance with another embodiment of the present invention.

Referring to FIG. 8, the semiconductor device 200 may be a portion of a memory cell, and the memory cell may include a DRAM memory cell.

The semiconductor device 200 may include a bit line structure BL that is positioned at a higher level than the buried word line 104. The bit line structure BL may be oriented at a direction crossing the orientation of the buried word line 104 (not shown), and a capacitor CAP that is positioned at a higher level than the bit line structure BL while being coupled to a portion of the active region 103.

The capacitor CAP may be coupled to a portion of the active region 103 through a storage node contact plug (SNC). The bit line structure BL may be coupled to another portion of the active region 103 through a bit line contact plug BLC.

The buried word line 104 may correspond to the word lines 104, 17 and 27 according to the above-described embodiments of the present invention. Therefore, the buried word line 104 may include the word line edge portion 104D.

According to the embodiments of the present invention, it is possible to suppress the bending of a word line by forming a dummy active region long.

According to the embodiments of the present invention, since the height of a dummy active region is lowered, a short circuit between a contact hole and a dummy active region may be prevented.

According to the embodiments of the present invention, since a capping layer edge portion between the word line edge portions is gap-filled, a short circuit between the contact hole and the dummy active region may be further prevented.

According to the embodiments of the present invention, since the capping layer edge portion is between the neighboring word line edge portions, widening of the contact hole may be suppressed.

According to the embodiments of the present invention, the connection between a word line contact plug and a word line may be improved, and accordingly, electrical characteristics and reliability of the semiconductor device may be improved.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a substrate including an active region and a dummy active region that are spaced apart by an isolation layer;
   a buried word line extending from the active region to the dummy active region; and
   a contact plug coupled to an edge portion of the buried word line,
   wherein an upper surface of the active region is positioned at a higher level than an upper surface of the buried word line,
   wherein an upper surface of the dummy active region is positioned at a lower level than the upper surface of the buried word line, and
   wherein the dummy active region has a shape that extends longer than the active region.

2. The semiconductor device of claim 1, wherein the edge portion of the buried word line includes a buried portion buried in the dummy active region; and a protruding portion formed over the buried portion, and
   wherein an upper surface of the protruding portion is positioned at a higher level than the upper surface of the dummy active region.

3. The semiconductor device of claim 2, further comprising:
   a capping layer covering sidewalls and an upper surface of the protruding portion; and
   a contact plug coupled to the upper surface of the protruding portion through the capping layer.

4. The semiconductor device of claim 3, wherein the bottom portion of the contact plug includes
   a first portion overlapping with an edge portion of the buried word line; and
   a second portion overlapping with the capping layer.

5. The semiconductor device of claim 4, wherein the second portion of the contact plug extends to overlap with one sidewall of the protruding portion of the buried word line.

6. The semiconductor device of claim 3, wherein the capping layer extends to cover an upper surface of the isolation layer.

7. The semiconductor device of claim 3, wherein the capping layer includes silicon nitride.

8. The semiconductor device of claim 1, wherein the buried word line includes a metal-based material, a doped semiconductor material, a metal nitride, a metal, or a combination thereof.

9. The semiconductor device of claim 1, wherein the edge portion of the buried word line includes a metal-based material, and the buried word line includes the metal-based material and a semiconductor material over the metal-based material.

10. The semiconductor device of claim 1, wherein a width of the contact plug is greater than a width of the edge portion of the buried word line.

11. A semiconductor device, comprising:
    a substrate including a plurality of active regions and a plurality of dummy active regions that are spaced apart by an isolation layer;
    a plurality of buried word lines that are buried in the substrate and extend from the active regions to the dummy active regions;
    a capping layer that covers an edge portion of each of the buried word lines; and
    a contact plug coupled to the edge portion of each of the buried word lines,
    wherein the edge portion of each of the buried word lines includes
    a buried portion buried in the dummy active regions; and
    a protruding portion formed over the buried portion and having a higher level than an upper surface of a dummy active region.

12. The semiconductor device of claim 11, wherein the capping layer covers sidewalls and an upper surface of the protruding portion.

13. The semiconductor device of claim 11, wherein the bottom portion of the contact plug includes
    a first portion overlapping with an edge portion of each of the buried word lines; and
    a second portion overlapping with the capping layer.

14. The semiconductor device of claim 13, wherein the second portion of the contact plug extends to overlap with one sidewall of the protruding portion of each of the buried word lines.

15. The semiconductor device of claim 11, wherein the capping layer extends to cover an upper surface of the isolation layer.

16. The semiconductor device of claim 11, wherein the capping layer includes silicon nitride.

17. The semiconductor device of claim 11, wherein the edge portion of each of the buried word lines includes a metal-based material, and the buried word lines include the metal-based material and a semiconductor material over the metal-based material.

18. The semiconductor device of claim 11, wherein the capping layer covers upper portions of the buried word lines, and the capping layer is buried in the substrate and extends from the active regions to the dummy active regions.

19. The semiconductor device of claim 11, wherein a width of the contact plug is greater than a width of the edge portion of each of the buried word lines.

20. The semiconductor device of claim 11, further comprising:
- a bit line structure positioned at a higher level than the buried word lines while crossing the buried word lines;
- a capacitor positioned at a higher level than the bit line structure while coupled to a portion of the active region.

21. A semiconductor device, comprising:
- an active region and a dummy active region separated by an isolation layer, the dummy active region having an upper surface that is positioned lower than an upper surface of the active region; and
- a buried word line extending from the active region to the dummy active region,
- wherein the buried word line is fully buried within the active region and only partially buried in the dummy active region.

* * * * *